United States Patent [19]

Marrs

[11] 4,450,929

[45] May 29, 1984

[54] ACOUSTIC ENERGY SYSTEMS

[76] Inventor: Ralph E. Marrs, 6809 Chateau Ct., San Jose, Calif. 95120

[21] Appl. No.: 415,190

[22] Filed: Sep. 7, 1982

Related U.S. Application Data

[60] Division of Ser. No. 148,482, May 9, 1980, which is a continuation-in-part of Ser. No. 903,489, May 8, 1978, abandoned.

[51] Int. Cl.$^3$ .................... H05K 5/00

[52] U.S. Cl. .................... 181/146; 181/151; 181/175; 181/199; 179/90

[58] Field of Search .................... 181/148, 149, 151, 152, 181/155, 175, 176, 198, 199; 179/1 E, 111 R, 88, 90; 165/104 M; 428/69, 74, 76, 106, 261, 182, 307

[56] References Cited

U.S. PATENT DOCUMENTS

| | | | |
|---|---|---|---|
| 2,115,129 | 4/1938 | Thienhaus | 179/1 E |
| 2,797,766 | 7/1957 | Sullivan | 181/151 |
| 3,378,098 | 4/1968 | Eiseman, Jr. | 181/148 |
| 4,004,094 | 1/1977 | Ott | 181/151 X |
| 4,101,736 | 7/1978 | Czerwinski | 181/151 X |

FOREIGN PATENT DOCUMENTS

| | | | |
|---|---|---|---|
| 111477 | 6/1965 | Netherlands | 181/151 |

*Primary Examiner*—Benjamin R. Fuller

*Attorney, Agent, or Firm*—Fraser and Bogucki

[57] ABSTRACT

A passive system having high volumetric compliance in response to compressions and expansions, such as are present in low frequency acoustic wave energy, employs a saturated vapor-saturated liquid interface thermodynamically stabilized by distributed heat sinks that interact with the acoustic wave energy. The volumetric compliance of a system, such as a loudspeaker enclosure, is significantly increased by utilizing a spatially distributed mass of fine fibers thoroughly wetted by a liquid, to provide thin liquid sheaths on the fibers that are in good thermal interchange with the fibers themselves and also with the vapor molecules in the spaces between the fibers. The liquid preferably has a low heat of vaporization, a high vapor pressure at the ambient temperature and a low rate of pressure change with respect to temperature. The liquid sheaths and fibers serve as high surface area heat sinks having a short thermal transport distance to supply the alternating heat attendant to evaporation and condensation. The fiber masses are preferably disposed in thin layers separated by communicating channels, so that the interaction takes place substantially uniformly within the volume occupied by the fibers, without substantial dissipation of energy in any concentrated region. With this system, at least one additional liquid having a high thermal mass may be employed in distributed fashion, further materially increasing the efficiency of the system and augmenting the volumetric compliance of the system.

45 Claims, 20 Drawing Figures

FIG. 2
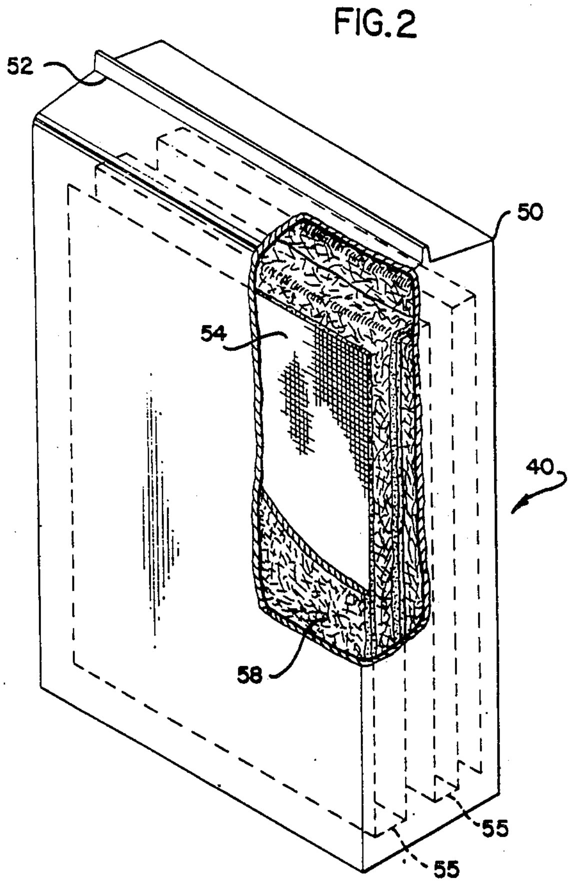
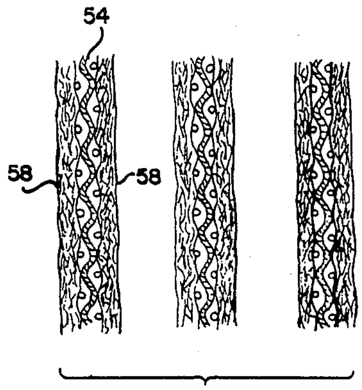
FIG. 3
FIG. 12
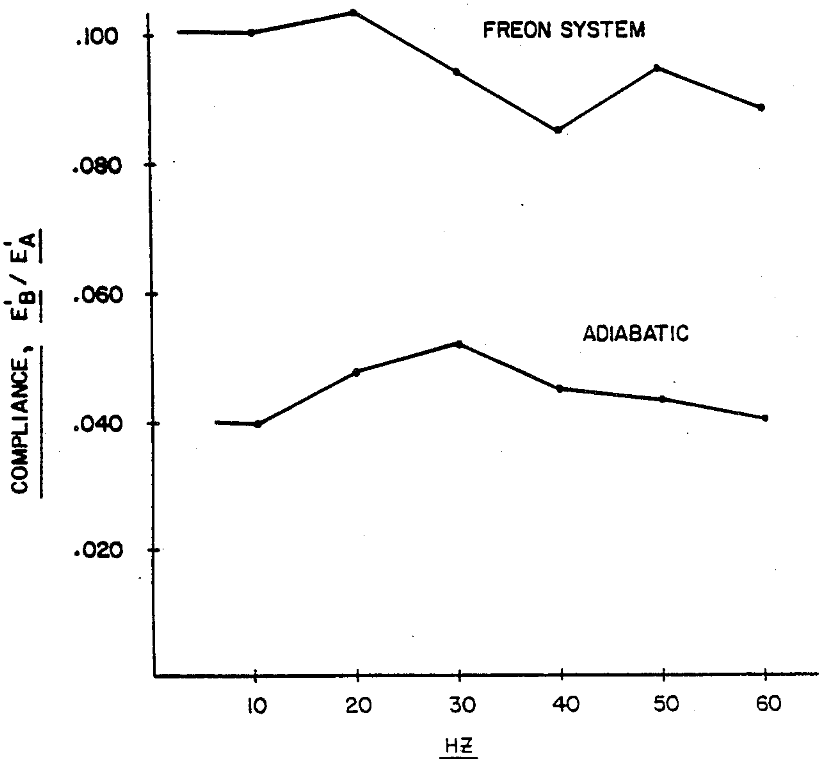

FIG.9
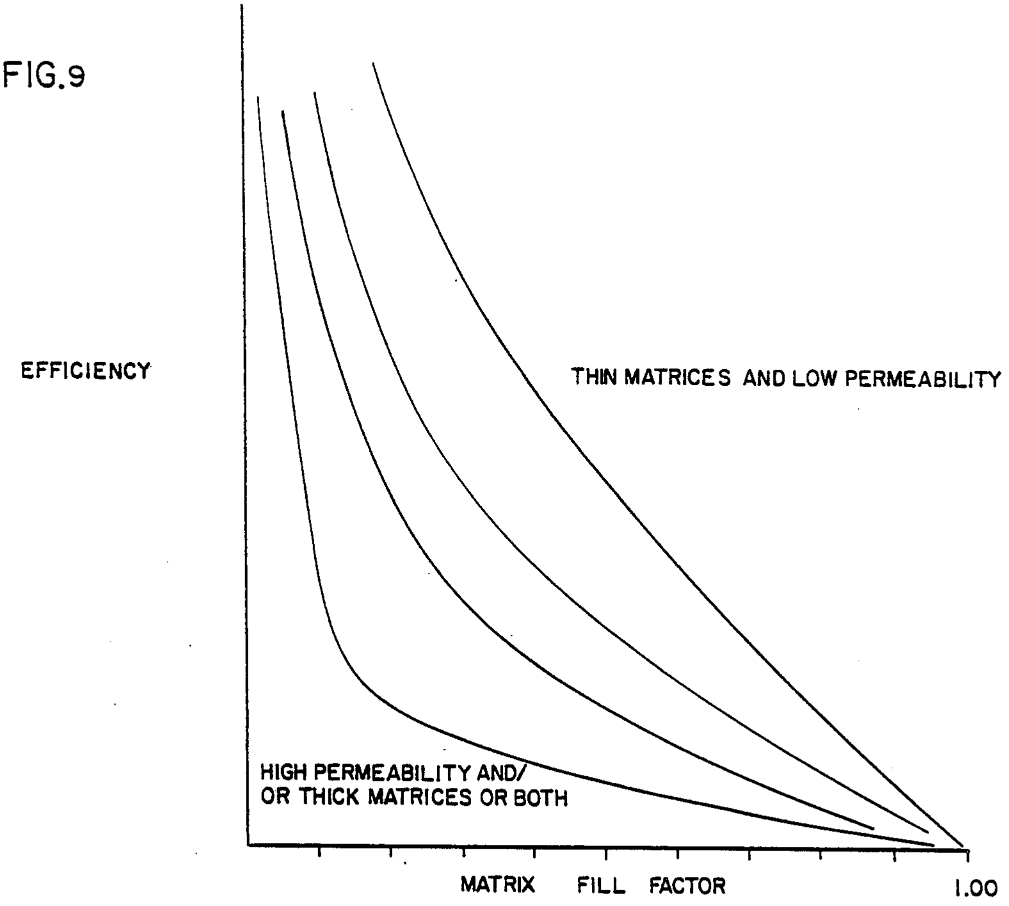
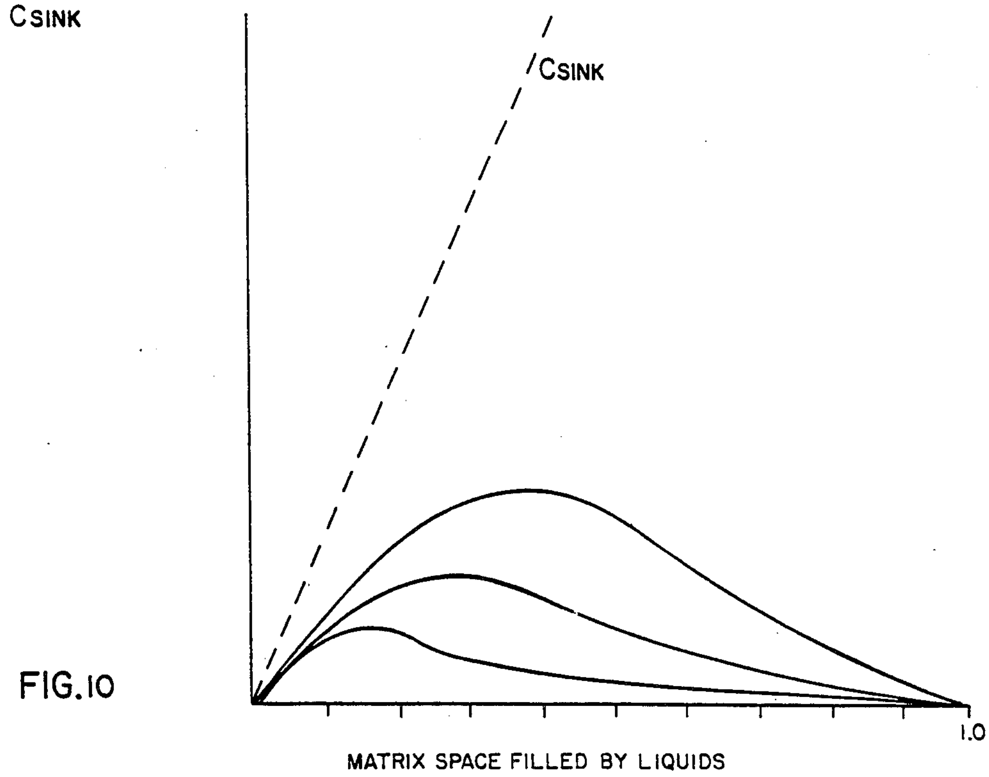
FIG.10

ACOUSTIC ENERGY SYSTEMS

This is a divisional application of application Ser. No. 148,482, filed May 9, 1980. Serial No. 148,482, filed May 9, 1980, is a continuation-in-part application of Ser. No. 903,489, filed May 8, 1978, now abandoned.

BACKGROUND OF THE INVENTION

Since an early date, as evidenced by the patent to Thienhaus, U.S. Pat. No. 2,115,129, there have been proposals for the use of saturated vapor-liquid systems in loudspeaker enclosures, using a low boiling temperature liquid. Thienhaus pointed out that condensation and evaporation effects occur, during movement of the diaphragm of the speaker relative to the enclosed volume in which the gas is contained, but his conclusion that restoring forces acting upon the diaphragm are beneficially modified as a result of condensative effects is not universally correct, as will be shown. It was of course known to employ glass fibers in a loudspeaker enclosure, as shown in the patent to Boudouris, U.S.Pat. No. 2,718,931, which utilizes an acoustically transparent film about the loudspeaker enclosure for other reasons, and the patent to Villchur, U.S. Pat. No. 2,775,309. The patent to Sullivan, U.S. Pat. No. 2,797,766, is of interest but utilizes a fundamentally different approach from Thienhaus, in that Sullivan proposes the use of a very heavy gas within a sealed loudspeaker enclosure, to improve low frequency response by reducing the sound velocity within the enclosure, thereby affecting the Helmholtz resonance frequency. Dutch Pat. No. 111,477 to Kleis of July 15, 1965 proposes the use of a liquid vessel within a separate, interior enclosure in a loudspeaker enclosure, with servo control of the temperature of the low boiling point liquid being used to prevent temperature variations. A fibrous (glass fiber) cylinder is disposed separately from the liquid supply but in the volume of the vapors. The temperature control and the use of a glass fiber structure are for the purposes of minimizing temperature variations and preventing the liquid-vapor system from dropping below a certain temperature.

A similar approach is shown in the patent to Ott, U.S. Pat. No. 4,004,094, in which a liquid is disposed within a loudspeaker enclosure, in a gas sealing bag, the liquid being held at a specific temperature by a sensing and control servo system, whose sensing means is different from that of Kleis. Ott suggests that the surface of the structure within the vapor space may be increased by the addition of steel wool, and a related suggestion can be found in Dutch Pat. No. 111,477. Ott specifies that the material of the container should have a high specific heat, for reasons which are not fully specified but which appear in any event to be in error. A related structure is taught by Czerwinski in U.S. Pat. No. 4,101,736, except that the gas-liquid system is supported in a cocoon or bag and a sound absorbent material of fibrous character (fiber glass) is loosely contained within the bag for "heating the fiber by excitation." This statement is apparently to be taken to mean that sound pressure waves absorbed in the fiber glass are supposed to be converted to heat, so as to supply heat to the system.

The teachings of these patents are all based upon the assumption that a liquid sump of a low boiling point liquid will fill the enclosure with vapor and that an efficient interchange between sound pressure waves, the vapor, and the sump liquid will result. The Dutch patent, the patent to Ott and the patent to Czerwinski all suggest that the presence of fibrous materials within the volume above the liquid will be beneficial, but for different reasons, none of which are explained in detail. It has been discovered, however, that when a thermodynamic energy interchange is involved between a gaseous and a liquid state of the same constituent, evaporation and condensation from a liquid sump is not efficient. Further, it is desirable to achieve, in practical applications, the closest approximation to theoretical efficiency that the system will provide, and it is evident that the prior art has not directed its attention to consideration of these aspects. It is apparent moreover, that a fibrous structure such as steel wool or fiber glass also acts to block transmission of sound waves, simply by functioning as an effective sound barrier. Thus filling an enclosure with fibers as suggested in prior patents is also contrary to some fundamental purposes of the vapor-liquid system. For these and other reasons discussed hereafter the beneficial effects of prior art systems have been sharply limited. The only known commercial application of the prior art is a line of loudspeaker systems due to Cerwinski of CERWIN-VEGA known as "Thermo-Vapor" (T.M.), whose interior volume compliance is about the same as dry, glass fiber systems due to Villchur of Audio Research Co. Neither class of systems achieves system compliance as good as would occur for an isothermal system of dry gases.

SUMMARY OF THE INVENTION

Systems in accordance with the invention provide a passively functioning gas-liquid interactive volume of high surface area that is widely distributed within an enclosure, to form a matrix of solid material and liquid sheaths providing distributed thermal masses functioning as heat sinks that are also coupled by short thermal transport distances to the vapor molecules within the adjoining spaces. The heat sinks supply the heat of vaporization, $H_{fg}$, required (during expansion) to evaporate saturated liquid molecules of the interactive fluid into saturated vapor molecules. At audio frequencies, this is a very localized interface event and therefore requires, in effect, a very great number of sites of very small size. The effectiveness of each site is directly proportional to the usable heat sink magnitude of that site and the vapor pressure of the interactive fluid. The effectiveness is inversely proportional to the fluid's heat of vaporization and to the rate of its vapor pressure change with respect to site temperature change. The thermodynamic events are symmetrically inverted during compressions. The presence of thin liquid sheaths on microfibers or comparable solids provides a very large distributed thermal mass having high effectivity in maintaining thermodynamic equilibrium. This effect may further be augmented by the employment of at least one other liquid having a high thermal mass dispersed throughout the system. The result, for the first time, is the provision of a volumetric gaseous system having dimensionless volumetric compliance that is substantially greater than unity, a result that transcends the apparent limit of isothermal gaseous behavior, a limit which had previously been widely accepted.

Further, in accordance with the invention, various considerations are observed as to the character of the matrix structure, the elements of which are wettable, or capable of being wetted, so as to distribute the liquids in the system uniformly, and arranged to be self supporting under the weight of the distributed liquid. Preferably the fibers or microelements that are employed are elongated solids having a specific length that is greater than 5000 inches per cubic inch of matrix space volume and a specific surface area greater than 50 square inches per cubic inch of matrix space volume. The matrix fill factor is in the range of 0.05 to 0.30, and the matrix solid fill factor is in the range of 0.01 to 0.1, and the fibers have diameters of less than 0.003 inches. A matrix having such microelements is significantly responsive to acoustic waves, but as noted from the fill factors, the mass employed within any small volume is limited. Preferably, the matrix is disposed in relatively thin layers into which the wave energy can penetrate, and separated by communicating channels through which the wave energy can disperse substantially uniformly, so that the energy interchange taking place throughout the entire enclosure is quite uniform. Systems in accordance with the invention are arranged to provide a distributed heat sink interactive with the space filling vapor phase molecules that is at least twice the mass of the vapor phase molecules. In fact, the effectively usable heat sink can be made so great that energy transfer to and from the sink can be much greater than the input mechanical energy of compression/expansion. With this system, the net effect is an increase in volumetric compliance by a factor of several times that of air, without the use of an equilibrium temperature controlling servo, an improvement obtained by incorporating some air in the matrix space volume as a pressure buffer, although some benefit can be derived by the input of thermal energy at a selected, constant rate into the system.

In one practical example of systems in accordance with the invention, a loudspeaker system may be constructed to enclose a volume containing one or a plurality of envelopes including wetted high surface material, such as folded fibrous layers providing a high surface-to-volume ratio, with the wetting liquid being dispersed throughout the volume. The volume within the envelope or envelopes may be saturated with the vapors from one liquid having a high vapor pressure and low boiling temperature, such as "Freon, " and another having a high thermal mass, such as water. A distributed dual phase system of this kind provides a compliant module with theoretical improvement of many times the same amount of high vapor pressure liquid contained in a sump and tested compliances four to twenty times higher than for systems constructed according to prior art. The volumetric complaince of the gas-liquid interface volume within the enclosing bag can be increased therefore many times relative to air thereby increasing the apparent volume correspondingly with a substantial reduction in the energy requirement for a low frequency transducer, lower cut-off frequency, or use of a smaller enclosure for the system.

In another example of devices in accordance with the invention, the bidirectional heat transfer characteristic of the gas-liquid interface is used to provide an efficient sound absorption mechanism for low frequency acoustic waves. Because the apparent polytropic gas constant is lowered substantially below unity, the particle velocities are proportionately much greater in relation to intensity, sound power or sound pressure level. The higher particle velocities in the gas now more readily transduce kinetic energy into heat energy in the fibrous materials that are present, attenuating the sounds with greater effect.

Yet other examples of systems in accordance with the invention relate to shock or motion absorbing devices and to acoustic lens systems. Shock and motion are absorbed more gradually within a given pressure range because of the higher compliance factor. In acoustic lenses a lowered propagation velocity stemming from a higher relative particle velocity provides effectively higher indices of refraction for purposes of converging or diverging acoustic waves.

BRIEF DESCRIPTION OF THE DRAWINGS

A better understanding of the invention may be had by reference to the following description, taken in conjunction with the accompanying drawings, in which:

FIG. 2 is a perspective view, partially broken away, of a high volumetric compliance module employed in the arrangement of FIG. 1;

FIG. 3 is an enlarged side sectional fragmentary view of a portion of the structure of FIG. 2;

FIG. 9 is a graph which presents the composite data for FIGS. 7 and 8 and displays efficiencies as functions of permeability and matrix thickness;

FIG. 10 is a graph that denotes the factor $C_{SINK}$ as a function of matrix fill factor;

FIGS. 12, 13 and 14 are graphs showing the variations of compliance, compressibility, and values of n with frequency when comparing adiabatic air to "two-phase" structures in accordance with the invention;

DETAILED DESCRIPTION OF THE INVENTION

A loudspeaker system provides a particularly suitable example of applications of systems in accordance with the invention, because of the stringent demands imposed on high performance stereo systems, and because of the numerous previous attempts to advance the state of the art. In accordance with the present invention, the apparent volume or virtual volume of a loudspeaker enclosure can be multiplied with consequent benefits in efficiency and low frequency sound reproduction but without imposing a substantial cost or actual size penalty.

Figure 1:
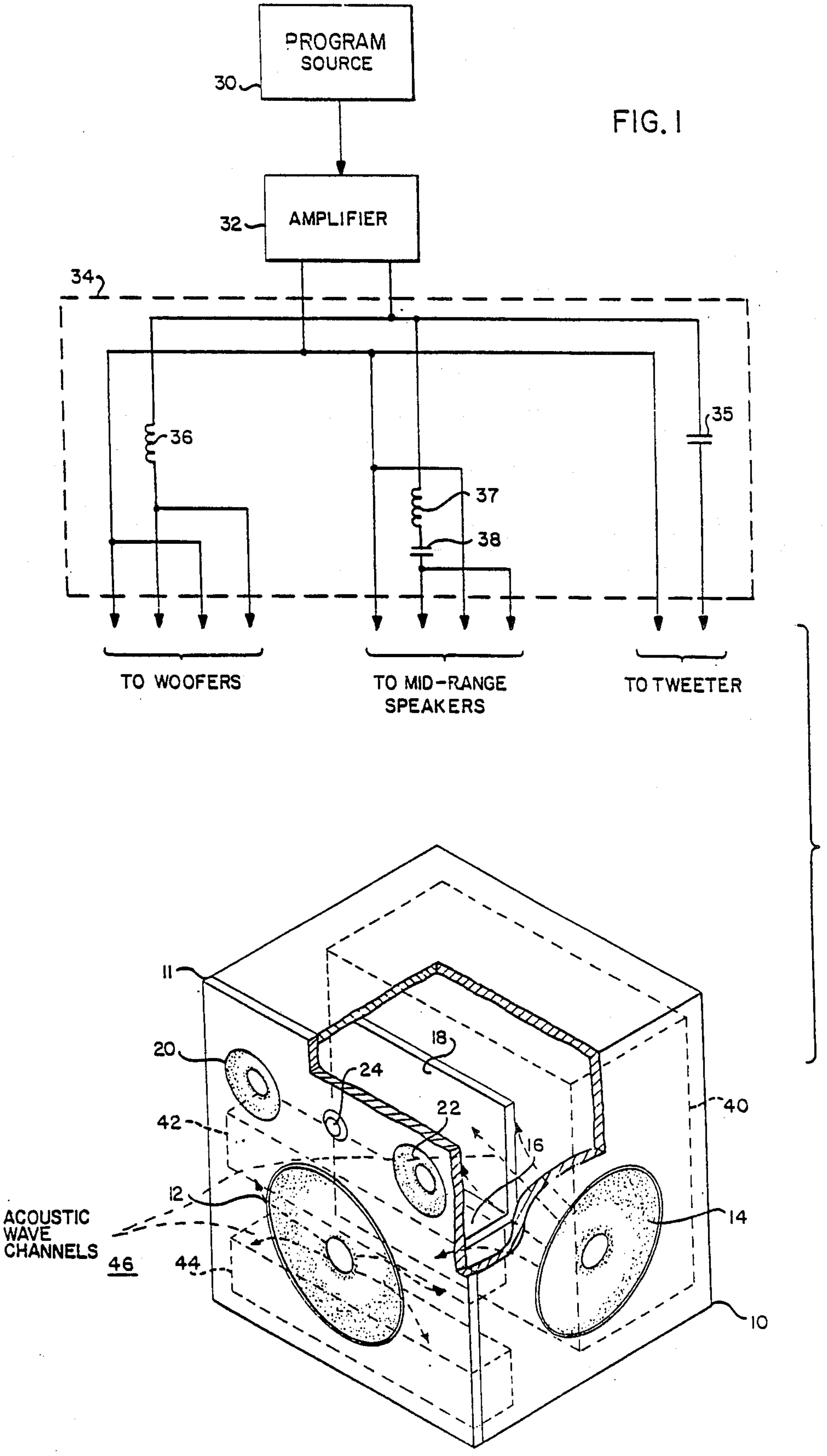
FIG. 1 is a combined schematic and perspective view of a loudspeaker system in accordance with the invention, incorporating high volumetric compliance structures.

As shown in FIG. 1, a loudspeaker enclosure 10 may comprise a conventional structure of wood or pressed board, having a front face against the interior of which a number of loudspeaker transducers are mounted. The dimensions of the enclosure 10 are of significance, because of the more efficient usage of internal volume that is achieved in accordance with the invention; in this example the walls of the enclosure 10 are assumed to be ¾" in thickness, and the enclosure has outer dimensions of 12" deep, 14" wide and 17" high, which gives a total interior volume of about 1.18 $ft.^3$. A pair of low frequency speakers or woofers 12, 14 are mounted in the front and one side face respectively of the enclosure 10. The woofers 12, 14 are of the high compliance, non-mass loaded, high efficiency type, of which many are commercially available. Because the volume of the speaker enclosure can be substantially reduced in accordance with the present invention, there may not be a substantial amount of front panel surface to receive a second woofer 14. The side mounted woofer 14, with its relatively large radiating area, can be accommodated in this side mounted fashion because low frequency sounds, with long wavelengths, have good diffractive properties and thus function in essentially omnidirectional fashion within the room or other volume in which they radiate.

A smaller interior volume is defined within the enclosure 10 adjacent the upper portion of the front panel 11, by a horizontal panel 16 above the first woofer 12, and a vertical panel 18 joined to the horizontal panel 16 and abutting the underside of the top wall of the enclosure 10. In the front panel 11 of the enclosure 10, adjacent and in communication with this smaller volume, are mounted a pair of 4" midrange speakers 20 and 22, and a high frequency speaker or tweeter 24, which in this example comprises a 1" dome-type tweeter.

Signals from a program source 30 provided through a driver amplifier 32 are coupled to the various speakers through a 6 dB per octave crossover network 34. In the crossover network, a capacitor 35 is coupled in circuit with the tweeter 24 to provide a high crossover point of approximately 6000 Hz. An inductor 36 is coupled in circuit with the woofers 12, 14 to provide a low crossover point of approximately 600 Hz, and an inductor-capacitor in series, 37, 38 are coupled to the midrange speakers 20, 22. It will be noted by those skilled in the art that the system thus far described is largely conventional except for the side directed woofer 14 and the relatively open unbaffled volume in communication with the back side of the woofers 12, 14.

The enclosure 10 also contains, however, a number of interior sub-volumes having substantially greater volumetric compliance than has heretofore been attainable in a configuration that is in communication with an ambient pressure environment. The interior space within the enclosure 10 includes a first large subenclosure of bag 40 substantially filling the rearward section of the enclosure from bottom to top and side to side, with dimensions of 15" high by 12" wide by 6" deep (front to back dimension). A similar subenclosure bag 42 having dimensions of 3" (height) by 4" by 12" is attached to the underside of the horizontal panel 16 adjacent the front panel 11, and a third subenclosure bag 44 is positioned adjacent the front panel 11 under the back side of the woofers 12, 14. It can be seen that the approximate interior dimension of the first bag 40 is 0.625 $ft.^3$, whereas that of each of the second and third bags 42, 44 is 0.0833 $ft.^3$.

The bags 40, 42, 44 are all constructed in like fashion, to have an acoustically transparent side on at least one broad face and to have a high interior surface to volume relationship (as will be described) so as to establish a high gas-liquid interchange area. As seen in FIGS. 2 and 3, the first bag 40 may comprise an acoustically transparent envelope 50 of generally rectangular form that is substantially sealed against permeation outwardly of an interior gas-liquid system. In this instance the bag is a polyethylene, polyester, or other suitable container having the approximate dimensions desired for the subenclosure, and may have gusseted sides for ease of top loading of its interior structure, so that the unit may then be sealed, as by thermal bonding along a seal line 52. Interior to the bag 50 is a self-supporting, liquid absorbing structure having the desired high surface-to-area ratio. As shown in FIG. 2, a number of spaced-apart gridwork layers are defined by successive parallel folds in a woven or other open grid structure 54, each layer of which is joined by a side edge 55 along the top or bottom of the structure to the next parallel gridwork layer. A fibrous mass that absorbs and distributes liquids is mounted on each face of each layer 54, comprising a thin surgical cotton fiber layer 58 (approximately 1/20" in this example). Joinder of the cotton to the grid structure may be effected by mechanical means, such as staples, although the layers 58 may also be affixed by sewing or a variety of other techniques. For convenience, the layers 58 may be affixed to the gridwork layers prior to folding into the desired multiple folded shape. It should be noted that the three subenclosures 40, 42 and 44 are preferably sized, relative to the interior spacings between the walls of the enclosure 10 to provide communication channels 46 along the side faces, to permit access of acoustic waves along the side faces, and also some bag expansion. The communication channels 46 provide substantial equalization of static and dynamic pressures throughout the enclosure 10. The bags 40, 42, 44 may be fastened in place by adhesive, nails or other means, and grommets or other sealing members may be utilized to prevent gas leakage from the interior if this presents a problem.

The self-supporting folded layer 54 and surgical cotton 58 structure, after insertion in its separate bag, is then wetted with liquids chosen to provide a gas-liquid system having desired thermal mass, boiling point and vapor pressure characteristics. In a specific example for the first and largest bag 40 four pounds of water at 85° F. is sprayed onto both sides of the fibrous mass and its mechanical grid support prior to folding of the structure so that the water is uniformly distributed, with adequate opportunity to saturate and coat each fiber. The structure is then folded as shown in FIG. 2 so that it will fit properly within the bag. During folding, the supporting grid structures are spaced on centers 3/16" apart so that an open space layer of greater than 1/16" (approximately 3/32") remains between the fibers of adjacent folds. It will be appreciated that such spacings cannot be depicted accurately in the Figures and that the drawings are not to scale. The folded, wetted structure is now placed in the bag.

It should be noted that prior to wetting, the cotton (or other fiber) will have a loft of as much as 1/4". During wetting the loft will diminish to a wetted mass of 1/10" (1/20" for each layer of fiber). The final density of the wetted mass will be about 13 lbs. per cubic foot. Depending on the fibers used, the original loft will vary, but the final density should be as stated, within a tolerance of perhaps ±4 lbs. per cubic foot. Then 8 ounces of approximately 55% by weight of "Freon R-11" (T.M.) of E. I. du Pont de Nemours Co. and approximately 45% by weight of "Freon R-113" (T.M.) are poured into the bag. This gives a boiling point for the mixture of approximately 90° F. The mixture may be preheated to approximately 80° F. before being poured in. The system is permitted to stand with the top open for approximately one minute to allow the interior pressures to equilibrate, and to permit the interior vapors, particularly those of the "Freon" which is heavier than air, to drive off some but not all of the air constituent. The bag 40 may then be sealed to confine the gas-liquid system. After sealing, the bag is rotated or tumbled to provide spatial distribution of the liquid Freons. The second and third subenclosure bags 42, 44 are similarly loaded with liquids in amounts proportional to their volumetric relationship to the first subenclosure bag 40, allowed to equilibrate, and then sealed.

When the sealed bags 40, 42 and 44 are mounted within the system enclosure 10 in the positions that have been described it will be appreciated that the sound pressure waves emanating from the back sides of woofer diaphragms 12 and 14 have unrestricted access to no less than three of the six faces of each bag 40, 42 and 44. This was accomplished by specifying the architecture such that large open communication channels 46 devoid of sound reflecting or attenuating materials provide acoustic communication from the woofers to the multiple faces of the multiple bags. The low frequency sound waves can travel virtually without restriction through the thin material of the faces of the bags, and they then encounter the more finely detailed structure of FIGS. 2 and 3 in which smaller open communicating channels have been provided between the fibrous layers that are interior to the bags. To add clarity to the principle of providing communicating channels 46 of high permeability, FIG. 20 more fully delineates one manner in which a large channel in communication with a woofer can be multiply divided into channels of lesser cross section area in order to conduct the pressure waves to the interactive bags (compliant modules) with maximum efficiency.

Now referring again to FIGS. 1–3 this configuration provides an enclosed volume within the enclosure 10 that partly contains air (although some other gas could be used) and partly the gas-liquid systems (water and "Freon") confined within the bags 40, 42, 44, at least one of the fluids being thermodynamically interactive as a two-phase fluid. The gas-liquid systems are equilibrated, in at least two different senses. First, the "Freon" constituents have a substantial partial pressure dependent upon the ambient temperature, the vapor pressure of the mixture of Freons being approximately 11 psi at 75° F. The water vapor pressure is more than twenty times less but does provide a contribution, and the air component acts as a pressure buffer, providing a partial pressure that supplies the differential to ambient pressure, or about 3 psi with the partial pressure previously given for "Freon". Adequate "Freon" is present, dispersed throughout the fibrous structure, to provide a liquid sink from which molecules may evaporate or into which they may condense thus ensuring pressure equilibration of vapor and liquid phases. A substantially greater amount of water is used to function as a heat sink having a large thermal mass, which assures temperature equilibration and whose heat sink characteristic is fundamental, as will be seen. Although other liquid mixtures and gas-liquid systems may be employed, the present example provides a good illustration of a system in accordance with the invention, and a particularly satisfactory structure for the loudspeaker application.

It will be appreciated that the matrix composed of cotton layers 58 supported by gridwork layers 54 within the bags 40, 42, 44 provides a widely distributed liquid heat sink interface having high wetted surface area in relation to the volume of the matrix, because there is not only a high square footage, but additionally each element of fiber when permeated with liquid provides a high surface area because of the small size of the microfibers. Matrix Space Volume (or simply Matrix Space and descriptively, "interaction volume") is defined as the volume of the region of space occupied by the wetted fibers including the interstitial spaces wherein the gas and vapor molecules reside. Matrix Fill Factor is the decimal fraction of this space occupied by liquids and solids. Matrix Solid Fill Factor is the decimal fraction of this space occupied by solids. For the matrix construction which has been described, the Matrix Fill Factor is about 0.2 and the Matrix Solid Fill Factor is about 0.04. Fiber diameter is substantially less than 0.003 inch, specific fiber length is greater than 5000 inches per cubic inch of Matrix Space and specific surface area of the wetted fibers is greater than 50 square inches per cubic inch of Matrix Space. For the majority of the molecules of the liquids and solids the Thermal Transport Distance (the length of the shortest path to a vapor/gas region) is less than 0.001 inch. For special applications even smaller diameter fibers than those typically used in surgical cotton may be employed, or one may use other fibers having irregular configurations to increase the available surface area even further. A very satisfactory alternative to cotton is "Thinsulate" (T.M.) M-200, a fibrous organic polymer insulating materials sold by the Minnesota Mining and Manufacturing Company. It should be thoroughly washed in solvent or strong detergent prior to use, in order to remove surface agents and promote wettability. The fibers are not absorbent, but when wetted the liquid is believed to exist in thin sheaths around the fibers and as fillets at fiber intersections, or as supported microdroplets. A small proportion of liquid detergent may also be added to the system liquids to promote wetting.

Consequently, the saturated vapors within the bags 40, 42, 44 are in good thermal and molecular communication with a saturated liquid of the same component, and can efficiently evaporate from or condense on the self-supporting wetted heat sink structure in response to an alteration in the externally imposed conditions of the system. Under these circumstances, impinging acoustic waves which appear as successive pressure waves depending in frequency upon the instantaneous acoustic spectrum of the sound being generated, encounter a gas/liquid/solid medium within the bags 40, 42, 44 that has unique compressibility characteristics. The distributed gas volumes tend to compress in response to the pressure waves, as does any gas, and thus exhibit some compliance for this reason alone. In addition to this compliance, an additional compliance can occur that is related to the condensation of vapor phase molecules into liquid phase molecules if, and only if sufficient distributed thermal mass has been provided. There is thus established a regime in which the pressure waves of acoustic energy encounter a gaseous containing volume that is substantially more compressible than a pure gas system alone. Furthermore, this is an ambient pressure system, requiring no special environment or high strength pressure vessel. The system is also passive and automatic in operation, whether acted upon by unidirectional, sinusoidal or transient pressure waves. Of equal importance, the system is reversible and bidirectional, in that condensation in response to increased pressure is equally accompanied by evaporation in response to decreased pressure. Furthermore, because of the high thermal mass in the solid/liquid portion of the system, the conversion of acoustic energy into thermal energy does not imbalance the system, which is held at substantially constant (ambient) temperature. From the description that has been given, those skilled in the art will recognize a loudspeaker system design that falls generally within the category known as infinite (or semi-infinite) baffle. However, virtually all loudspeaker-enclosure-baffle-horn system designs must encounter and accommodate to the properties of the gas environment proximate to the surfaces of the structure. In most if not all cases, the various designs including infinite baffle, ducted port, horn, bass reflex, transmission line, etc. can realize benefits by substituting a region of higher compliance in accordance with the teachings of the present invention.

With this general visualization of the operation of the gas-liquid system in accordance with the invention, it can be appreciated that back waves generated by the loudspeaker woofers 12, 14 encounter an entirely different compressibility, or volumetric compliance, characteristic than has heretofore been possible, given a similar volume. The most troublesome low frequency waves in the enclosure in the region of 100–400 Hz operate on the gas-liquid system to effect alternation between the condensation and the evaporation phases, so that the enclosed waves are far more effectively accommodated and the low frequency characteristic of the loudspeaker system is substantially enhanced. There is no low frequency limit for the increased compliance effect, in fact best performance occurs at lowest frequencies. The 100 Hz figure referred to above is a typical range for sensible audio effects, but it is recognized that there is often a need for enhanced performance at 60 Hz and below, all the way down to zero frequency (unidirectional compression or expansion). On the other hand, the response time of a thermodynamic system involving heat transfer places upper limits (dependent upon the gas-liquid system and the dispersion factors that are employed) upon the frequency at which a beneficial effect can be obtained. It appears that this upper limit ranges, dependent upon the system, from several hundred Hz to of the order of a few kilo Hz.

As the system approaches its upper frequency limit, diminution in the effect of enhancing compliance occurs because the required heat transfer has insufficient time in which to proceed to completion. Stated in another way, the heat transfer, and consequently condensation-/evaporation occurrences have begun to lag behind the causative acoustic pressure variations, i.e., a phase lag has developed. A consequence of phase lag is that larger differential vapor pressures and temperatures will exist dynamically. Now the heat transfer occurring across a larger temperature differential will have the effect of increasing the entropy, and this may be viewed simply as a damping effect. Thus, as the volumetric compliance enhancement begins to diminish, it is smoothly joined by and gradually replaced by (at higher frequencies) an enhanced damping effect, which in itself may be considered beneficial, and which in any case provides a smoothing or gradualness of effect in response to increasing frequency.

A more detailed understanding of the operation of this system must make reference to the thermodynamic relationships and theory which govern the events.

The well known equation $PV^{\gamma}$=Constant, with $\gamma=(c_p/c_v)$ describing adiabatic, isentropic compression behavior of a perfect gas is only one special case of the more general polytropic gas equation, $PV^n$=Constant. The polytropic equation which allows the polytropic constant n to take on an infinity of values includes other special cases such as the constant temperature case, $PV^{1.0}$=Constant and the constant pressure case, $PV^0$=Constant. In general, for a perfect gas (and all vapors approach perfect gas behavior if the process is limited to small changes of state), if heat is added during compression, n will have value greater than $\gamma$, and if heat is removed during compression, n will have value less than $\gamma$. When the heat removed is exactly equal to the compression work input, n=1.0, which is the constant temperature case. If even more heat is removed, n will be less than 1.0, and as shown by $(P_1V_1/T_1)=(P_2V_2/T_2)$ (a form of the Universal Gas Law: PV=mRT), $T_2$ for the compression will be less than $T_1$ and the heat removed will be greater than the compressive work input. It is possible to remove heat at such a rate that n takes on values less than zero, in which case, $P_2$ will be less than $P_1$. Evidently, heat transfer is central to the behavior of the compressive process.

BRIEF SUMMARY OF THE UNIFIED THEORY

It can be shown that the factor n in the polytropic equation for perfect gases can be regarded as the dimensionless volumetric stiffness, i.e., the dimensionless form of the definition of volumetric stiffness;

$$n = -\frac{dp}{dv}\left(\frac{V}{P}\right) \simeq -\frac{\Delta_p/P_0}{\Delta_v/V_0}$$

for small compressions and also, therefore, that n=(1/C) where C is the dimensionless volumetric compliance, i.e., the dimensionless form of the volumetric compliance:

$$C = -\frac{dv}{dp}\left(\frac{P}{V}\right) \simeq -\frac{\Delta_v/V_0}{\Delta_p/P_0}$$

for small compressions

If the method of partial volumes is used:

$$C = \frac{\Sigma v_i C_i}{\Sigma v_i}$$

where $C_i$ is the dimensionless compliance of volume $v_i$.

We have at once $$P(\text{volume})^n = P(\text{Volume})^{\Sigma v_i/\Sigma v_i C_i} = \text{Constant}$$

In this form the equation describes compressive-expansive behavior of all systems including superheated vapors, saturated vapors (the perfect gas restriction has been eliminated), saturated liquids, and solids as well as any mixture of the constituents named. Henceforth, for all systems, we may consider the equation $PV^{(1/C)}$=Constant to be descriptive and predictive.

Also, we may equally well use $PV^n$=Constant where $n=(1/C)$ with the restriction that we identify n now as the "apparent" polytropic gas constant for the system. Under the generalized volume and compliance $v_i$ and $C_i$ respectively a number of relationships can exist, as set out in Table A. A number of terms in Table A are defined in Table B immediately following.

TABLE A

| Volume $v_i$ | | | Compliance $C_i$ |
|---|---|---|---|
| $v_\gamma$ | A volume of vapors, superheated not experiencing heat transfer during compression | $C_\gamma = \frac{c_v}{c_p}$ | where $c_v$ and $c_p$ are the usual specific heats, constant volume and constant pressure, of the vapor at the specified temperature and pressure. |
| $v_{H.S.}$ | A volume of superheated vapors experiencing heat transfer to a heat sink during compression | $C_{H.S.} =$ | $\frac{H.S.\left(\frac{c_p - c_v}{c_p}\right)}{H.S. + c_p}$ |
| $V_{MIX}$ | A volume of saturated vapors, in communication with saturated liquids and, perhaps, other heat sinks both liquid and solid | $C_{MIX} =$ | $C_\gamma + C_{CONDENSE} + C_{SINK}$ |
| | | $C_{CONDENSE} =$ | $\frac{S.H.S.M.\left(\frac{c_p - c_v}{c_p}\right)}{S.H.S.M. + c_p}$ |
| | | $C_{SINK} =$ | H.S.M. (ccc) |

TABLE B

| Symbol | Definition |
|---|---|
| H.S. | Magnitude of heat sinks(s) in communication with the volume of superheated vapor, per pound of superheated vapor $= \frac{\Sigma Wt._i c_i}{Wt._{SUPERHEAT\ VAPOR}}$<br>$c_i$ = specific heat capacity of the heat sink material |
| H.S.M. | Magnitude of heat sink(s), liquid and/or solid per pound of saturated vapor of the condensable fluid $= \frac{\Sigma Wt._i c_i}{Wt._{VAPOR\ OF\ THE\ FLUID}}$<br>$c_i$ = specific heat capacity of the liquid or solid, i. |
| S.H.S.M. | Super heat sink magnitude. Participates by removing (or adding) heat from the vapor during evaporation of liquid. Can have positive, negative or zero value. = $-\frac{H_{fg}}{S_{fg}}\left(\frac{\gamma S}{\gamma T}\right)\Big\vert_{\text{saturated vapor}}$<br>H = Enthalpy per pound<br>S = Entropy per pound |
| ccc | Condense compliance coefficient. Relates the energy removed from the vapor (including the compressive work input) to the temperature rise of the heat sink. Heat removal from the vapor is due to reducing the weight of vapor that exists, by condensation. = $\frac{V'_{fg} P_o'}{V_g' k_1 \left(\frac{\gamma P}{\gamma T}\right)'\Big\vert_{\text{saturated vapor}}}$<br>The prime designation indicates that these values are taken from tables of properties, which is the partial pressures domain. Values are for the temperature specified for the system operation.<br>$k_1 = H'_{fg} + \frac{(PV)'_{fg}}{J}$ Note: $\frac{(PV)'_{fg}}{J} \simeq$ Compressive work input<br>$J = 778.26 \frac{\text{ft. lbs.}}{\text{Btu.}}$ |

The understanding provided by these forms is that for all contributions to compliance for any system that can be defined, the mechanism is heat "removed" from the vapor. In all cases, the numerators and denominators for definition of compliance $C_i$ have units of specific heats, namely Btu per °F. per pound, in English units. (In the case of $C_{SINK}$, consider that the denominator is (1/ccc). Although the term S.H.S.M. (Super Heat Sink Magnitude) in $C_{CONDENSE}$ can have different values it still possesses the behavioral and dimensional properties of a heat sink. In the case of $C_\gamma$ we find that the vapor is itself a heat sink whose magnitude is $c_v$, and that the heat energy "removed" is stored as internal energy, $\Delta E = c_v \Delta T$, rather than as (PV/J) energy.

For super heat volumes:

$$C = C_\gamma = C_{H.S.}$$

For mixtures volumes:

$$C = C_{MIX} = C_\gamma + C_{CONDENSE} + C_{SINK}$$

$C_{MIX}$

The behavior of the terms $C_{CONDENSE}$ and $C_{SINK}$ and their contributions to compliance $C_{MIX}$ require special attention and understanding.

$C_{CONDENSE}$ $C_{CONDENSE}$ is an operative term for all systems involving condensative effects. Moreover, its effects serve to reduce, eliminate or even to reverse the effects on compliance of condensative systems as they have been taught heretofore.

Figure 4:
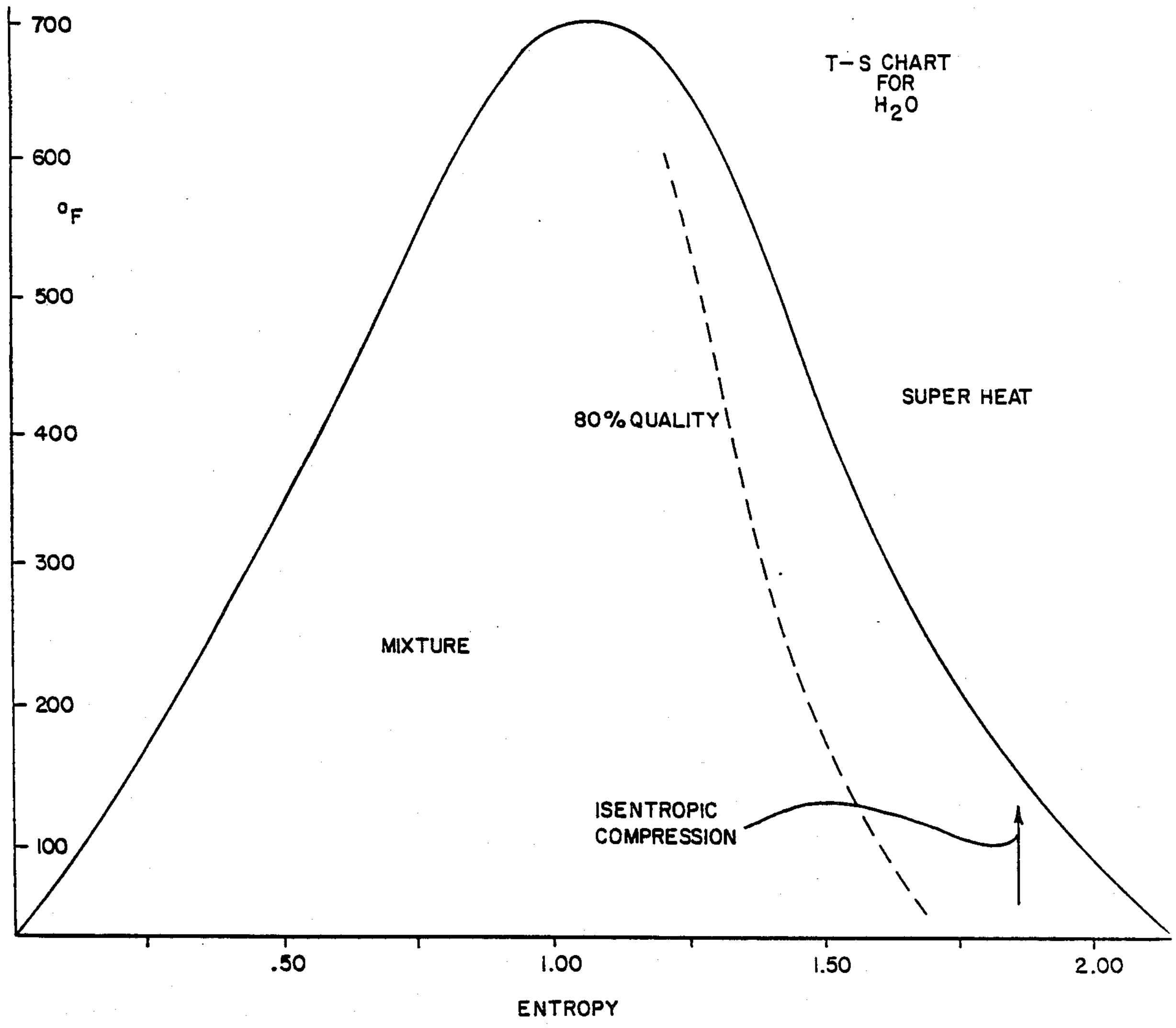
FIG. 4 is a temperature-entropy chart for $H_2O$.
Figure 5:
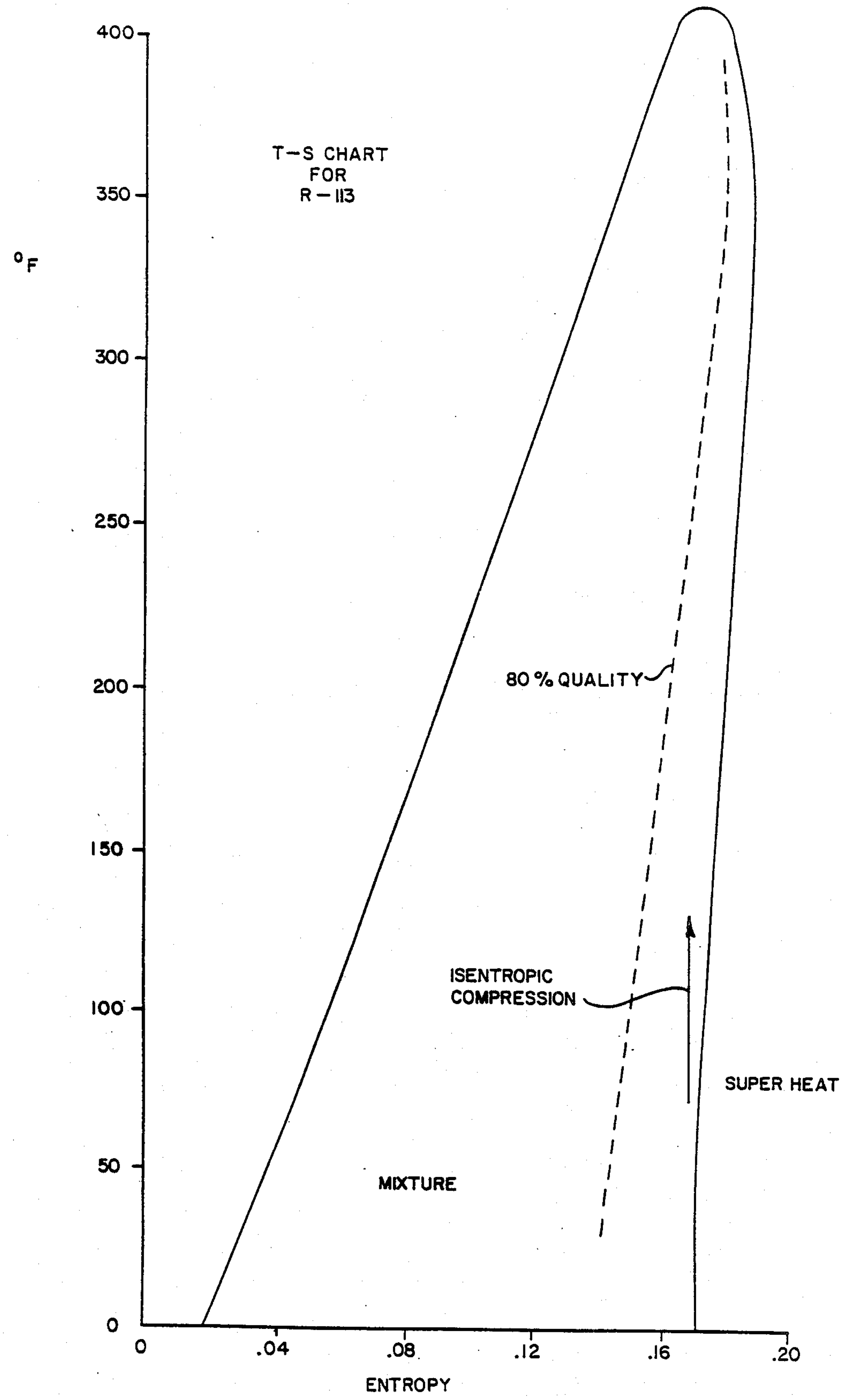
FIG. 5 is a temperature-entropy chart for "Freon R-113" (F-113)

FIGS. 4 and 5 show temperature-entropy relationships for $H_2O$ and R-113. During small compressions occurring at low frequency the system will follow a state change path wherein $\Delta S$ approaches zero, for the system. Discounting the effects of sumps for the moment, the sites of condensative behavior, in accordance with prior teachings, will be characterized by large quantities of vapor of the fluid and small or negligible quantities of liquid of the fluid. That is, for these regions, the quality, X, defined as $$\frac{Wt._{vapor}}{Wt_{vapor} + Wt_{liquid}}$$

will approach unity.

Previous teachings appear to have been unanimous in propounding two concepts, and both will be shown to be incorrect (in many cases) in important regards:

(1) For a mixture of liquid and vapor of a fluid in saturated equilibrium, condensation will accompany compression and conversely evaporation will accompany expansion.

(2) When condensation occurs, compliance will be enhanced.

However, FIG. 5 shows that for R-113 at 23° F. and very high quality a small isentropic compression will cause neither condensation nor evaporation. (The quality (X) will be unchanged). FIG. 5 shows also that at lower temperatures (and at very high temperatures) isentropic compression will actually be accompanied by evaporation. Similarly, high quality mixtures of $H_2O$ at any temperature exhibit evaporation when compressed isentropically. In general, for any fluid, regions exist where isentropic compression is accompanied by evaporation. More importantly those in the art can now recognize that many, if not most of the fluids which possess high values for condense compliance coefficient, ccc, are not "good" fluids by that fact alone. Such fluids may have such a small degree of condensation in response to compression, if quality (X) is high, that any contribution to compliance (positively or negatively) will be negligible. R-11 and R-113 are examples of such fluids, and one therefore knows that a coaction must be established with some other factor (i.e. the heat sink magnitude must be increased) for the potential benefit of the fluid to be realized.

It is incorrect therefore to claim significant compliance benefits for two phase systems unless one specifies also that (a) the quality (X) of the mixture is restricted to very low values or (b) that effective, auxilliary heat sinks are provided so that (1) condensation will accompany compression and (2) the rate of condensation will be great enough to significantly affect compliance. Moreover, when calculating or estimating the mixture quality, only that liquid which is spatially distributed in the vapor space may be considered; any liquid in sumps, puddles, pools or large drops belongs to a separate sub-system which does not participate with thermodynamic significance in the condensation event, because: at low audio frequencies, the two-phase condensative/evaporative event is limited by the rate at which heat conductance can occur from the interior regions of the heat sinks provided. The viable thermal transport distance of the heat transfer into the sink is generally less than 0.001 inch at any audible frequency. Thus, pools, puddles, etc. belong to a different sub-system and may not be considered when calculating either the effective quality of the mixture or the compliance benefits to be expected. Similarly, the heat capacities of container walls must be discounted so greatly as to effectively disqualify them as heat sink contributors.

With the stated restrictions that (1) quality is not low and (2) that auxiliary spatially distributed heat sinks have not been provided, it can be categorically stated that if condensation accompanies compression, compliance will be lessened and conversely that if evaporation accompanies compression compliance will be enhanced in comparison with the superheat case. A small isentropic compression using a high quality mixture, non-heat sinked, of any two phase fluid whatsoever, when investigated by use of well known thermodynamic equations will confirm this statement absolutely.

Figure 6:
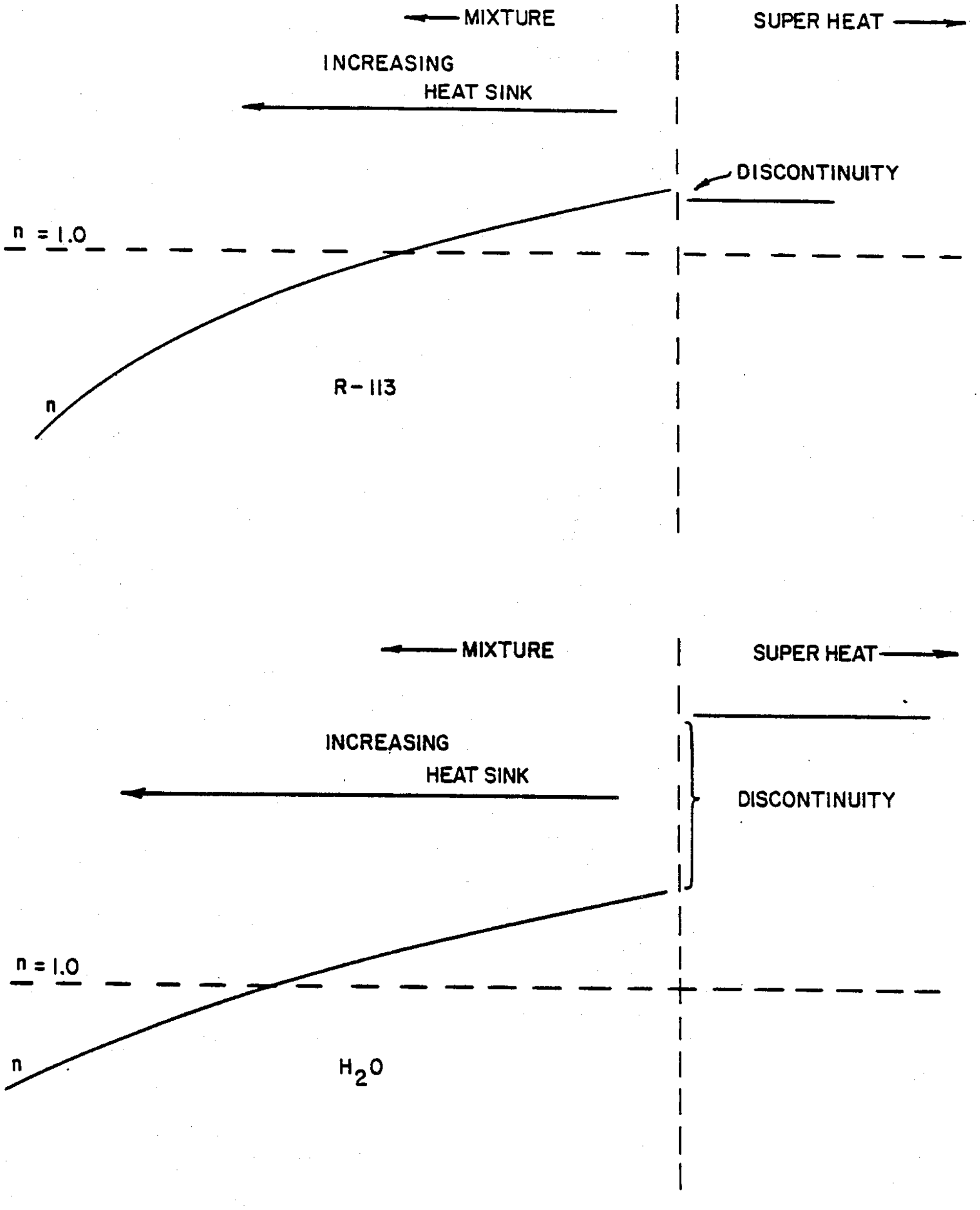
FIG. 6 is a curve showing the behavior of dimensionless volumetric stiffness n for $H_2O$ and R-113, temperature 75° F., and various conditions of mixture, heat sink and superheat.

The expression for $C_{CONDENSE}$ given earlier evaluates these effects numerically. Its magnitude and sign are not functions of the quality of the mixture of the system. Thus sumps may now be reintroduced, affecting quality, if one chooses, but without affecting the behavior, magnitude or sign of $C_{CONDENSE}$, which will be determined by the fluid used and its temperature. $C_{CONDENSE}$ is responsible for a discontinuity in the dimensionless volumetric compliance and the apparent polytropic gas constant n as the boundary is crossed from super heat vapors to saturated mixtures. This discontinuity for R-113 is shown in FIG. 6.

The behvior of high quality mixtures of saturated $H_2O$ vapors with saturated liquid is cited as additional evidence. FIG. 4 shows that such a mixture will move to higher quality during compression if $\Delta S$ is held near zero. That is, compression will be accompanied by evaporation. Handbooks show a discontinuity in the value of the dimensionless stiffness, n, from about 1.32 (superheat) to about 1.11 (high quality mixture) and this discontinuity is illustrated in FIG. 6. Evaluation of the term $C_{CONDENSE}$ for $H_2O$ shows that the discontinuity in the value of n is exactly due to this term. So it is evaporation during compression that reduces stiffness in this case rather than condensation. And for R-113 at 70° F., condensation does accompany compression, but compliance is lessened relative to the superheat behavior.

$C_{SINK}$

In all condensable systems there is one more factor or term in the controlling equation. It is linearly dependent on the usable magnitude of heat sink that is provided at the site(s), and it is this factor which is overwhelmingly responsible for compliance improvements in well designed condensable systems. The factor is $C_{SINK}$ which is the third contributor to compliance in $C_{MIX}$. $C_{SINK}$ contains the factor (ccc) which contains the factor $V_{fg}'$. $V_{fg}'$ is a volume change due to condensation, so we see the second of two condensative effects on compliance. (The first appeared in $C_{CONDENSE}$).

$$C_{SINK} = H.S.M. \times (ccc)$$

In the expression for ccc the factor $V_{fg}'$ may be thought of as a factor which "generates" compliance by condensing vapor (very large volume) into liquid (small volume). The value of ccc determines how "efficient" or effective the fluid is in accomplishing this generation of compliance, i.e., how efficiently the fluid makes use of any heat sink, H.S.M., which is provided in the system. The sign of this term is always positive. That is, $C_{SINK}$ always enhances compliance, and the enhancement is linearly related to the amount of spatially distributed heat sink that has been provided. The heat sink is comprised of all liquids and solids that qualify as spatially distributed and this includes the weight (1-X) of the liquid fraction of the interactive fluid that is spatially distributed.

In $C_{MIX} = C_\gamma + C_{CONDENSE} + C_{SINK}$ the term $C_{CONDENSE}$ is negative for many systems. It is not until the positive compliance of $C_{SINK}$ offsets the negative contribution of $C_{CONDENSE}$ that the system reverts to a compliance equal to that of the super heated system. Only for $C_{SINK}$ greater than this is any net compliance improvement (over the super heat system) realized. And, even greater improvement must be made before n falls below unity or C exceeds unity.

In accordance with the invention, available matrices can accomplish very large values for $C_{SINK}$ with resulting system compliance enhancement and system values for n substantially below unity. A massive cumulative heat sink is provided, with the heat sink distributed to the condensable sites in the vapor space and with each heat sink so proximate physically and with such efficient conduction of heat to the condensable fluid of the site, that the heat capacity present can be effectively utilized. For these conditions to be met the physical dimensions, per site, are made exceedingly small, and the quantity of such sites in the vapor space are exceedingly large, while the heat sink magnitude of each site is made as large as possible.

In all pure gas systems, using air or some other gas, the dimensionless stiffness n is equal to or greater than 1.0, with n being approximately equal to 1.0 only in the case of an isothermal compression/expansion system. However, in accordance with the invention, the value of n is brought substantially below 1.0, and the lower the value of n the higher the compressibility (compliance). As noted briefly above, this is a dual-action compressibility system, with pressure causing a volumetric change both with conventional compliance as in a pure gas system where n is greater than unity and with the compliance provided by molecular condensation to large heat sinks. The sum of the thermal energy absorption which is much greater than the input kinetic energy brings the value of n substantially below unity. The relationship between compression and expansion is completely symmetrical, so that the system may properly be termed bidirectional. As condensation occurs during compression, the latent heat of vaporization of the vapor phase molecules is given up to the solids and liquids of the heat sinks provided, thus raising temperature slightly. Conversely, however, as evaporation occurs during expansion the latent heat of evaporation is supplied by the liquid and solid phase molecules and the heat sinks are consequently slightly cooled. It can be seen that system performance depends substantially upon the presence of good heat sinks to facilitate the evaporation/condensation reactions. Thus in the present system the inclusion of a substantial amount of water provides low cost, stable, heat sinks having an extremely high thermal storage capability.

An added consideration in the system is the condense compliance coefficient, ccc, of the constituents in the gas-liquid system. The "Freon" family of gases provides one acceptable example, because these are safe, stable gases having high values for ccc and a range of boiling points. See Table C.

TABLE C

| Fluid | Temperature | Partial Pressure | ccc |
|---|---|---|---|
| $H_2O$ | 70° F. | .363 psia | .0263 |
| $H_2O$ | 180° F. | 7.51 psia | .0425 |
| R-11 | 70° F. | 13.39 psia | .574 |
| R-113 | 70° F. | 5.523 psia | .606 |
| R-12 | 70° F. | 84.8 psia | .854 |

The partial pressure of the vapor phase is to be kept below ambient pressure, considering the ambient temperature to which the system is to be exposed. Inasmuch as room temperature can be assumed for most loudspeaker systems, and an ambient pressure existing at sea level or some modestly high elevation is usually encountered, "Freon 113" is an excellent fluid, because it can be used in the range of 50° F. to 115° F. to provide a vapor pressure in the range of 22–92% of the ambient (e.g. 14.7 psi). As another example, "Freon 12" which has a substantially higher vapor pressure, would be acceptable under colder ambient conditions, or for that type of system in which the ambient pressure was sufficiently high—this would not necessarily be a loudspeaker system. Different families of gas-liquid systems will generally best be suited for specific applications, but it should be understood that the concept is not specifically limited in this regard.

The presence of a minor amount of air in the system provides the function of maintaining the internal system pressure substantially equal to the ambient pressure, under a normal range of ambient temperature and pressure variations. Consequently, a moderate change in the partial pressure of a constituent forming a gas-liquid interface changes the volume slightly but does not change the total interior pressure, and structural and operative requirements for the subenclosure are minimized. In the present example, a low cost, relatively thin gauge, plastic bag may be used for enclosing the high compressibility system without fear of collapse or undue expansion due to moderate ambient pressure differentials.

Compliance Measurements

A test series was designed and conducted for the purpose of measuring the actual compliance of a number of configurations. These tests yielded data as to

- measured versus calculated limit value (efficiency)
- performance of various matrix materials
- performance of various heat sink materials, including both liquids and solids
- performance of various condensable fluids
- the effect of thickness of the matrix materials
- performance as a function of "matrix fill factor", the percent of matrix space occupied by liquids and solids.

A closed test chamber, nominally 87 $in^3$ was constructed with a removable access port. This volume was in good communication with a cylinder and piston arrangement whose action at 10.6 Hz served to alter the volume of the test chamber by ±3.48 inches, peak to peak, in nominally sine wave fashion. The test chamber was fitted also with a pressure sensing means of high accuracy and frequency linearity very nearly down to zero Hz frequency. For each of the various tests, a sealed plastic bag was contained within the test chamber. Further, the sealed bag contained, generally, super heated vapors (air), vapors of the fluid, liquid of the fluid, liquid of another fluid ($H_2O$), and matrix materials, usually of a fibrous matt form which acted also as solid heat sink material as well as acting as a mechanical support and provider of sites.

In all tests the frequency was held constant, the total test chamber volume was held constant, and the imposed volumetric compression (±3.48 $inches^3$) was held constant. For each configuration a single data point was obtained, namely the RMS value of the alternating component of the pressure in the test chamber (measured inside the test chamber, but outside the plastic bag). The RMS pressure change value was converted mathematically to a peak pressure to correspond to peak volumetric compression imposed. Volumes and weights of all constituents were measured and recorded for each test.

The test data were processed by the methods of partial volume wherein the volumes were:

$v_1$=communicating volume of super heated vapor (air) within the test chamber, but outside the plastic bag. Adiabatic.

$v_2$=partial volume of super heated vapor (air) contained within the test sealed plastic bag, but not in heat transfer communication with the heat sink capabilities of the solids and liquids of the matrix space. Adiabatic.

$v_3$=partial volume of the vapors of the fluid within the bag but not in heat transfer communication with the matrix heat sinks. Adiabatic.

$v_4$=partial volume of super heated vapor (air) of the matrix space, and therefore in good heat transfer communication with the matrix heat sinks.

$v_5$=partial volume of the vapor of the fluid of the matrix volume. This is a volume which possesses three additive compliances, $C_\gamma$, $C_{CONDENSE}$, and $C_{SINK}$.

$v_6$=partial volume of the solids and liquids of the matrix volume. Compliance for this volume is zero.

In dimensioned form, for each test, system compliance, $C_T$, was simply $\Delta vol_{peak}$ divided by Δ pressure peak in appropriate units:

$$C_T = -\frac{3.48\ in^3/1728\ in^3\ per\ ft^3}{\Delta_{ppeak},\ lbs\ per\ ft^2}$$

By the measurement of volumes and weights the compliance contributions of the partial volumes $v_1$, $v_2$, $v_3$, $v_4$ and $v_6$ were computed directly.

From $C_T = \Sigma C_i$ then, the compliance of $v_5$ become at once: (in appropriate units)

$$C_{v5} = C_T - C_{v1} - C_{v2} - C_{v3} C_{v4} \text{ with } C_{v6} = 0$$

The compliance $C_{5SINK}$ was then extracted from the equation $$C_5 = C_{5\gamma} + C_{5CONDENSE} + C_{5SINK}$$

after calculating $(C_{5\gamma} + C_{5CONDENSE})$.

Now, $C_{5SINK} = C_{5SINK,\ ACTUAL}$ by terminology.

The compliance, $C_{SINK,\ LIMIT}$ was computed according to the methods and definitions which have been given here. Then actual versus limit values were compared in several contexts.

Figure 7:
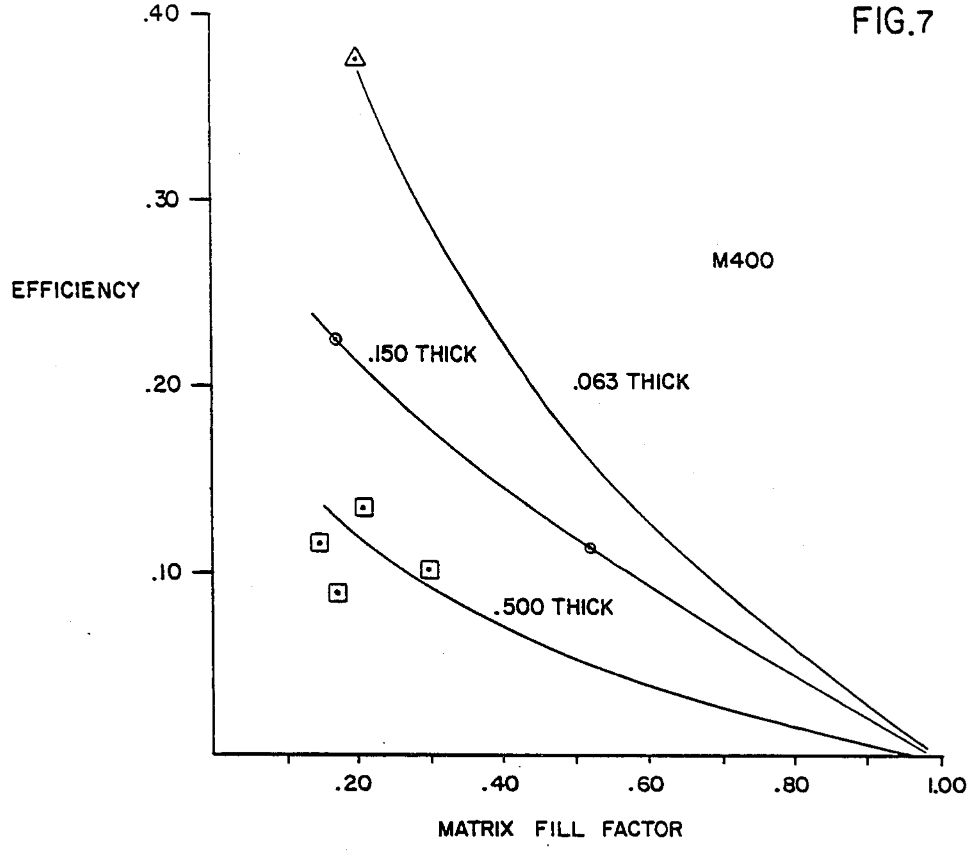
FIGS. 7 and 8 are graphs showing actual efficiencies of usage of heat sink magnitude when various configurations, liquids and matrix materials were treated for compliance behavior at 10.6 Hz.
Figure 8:
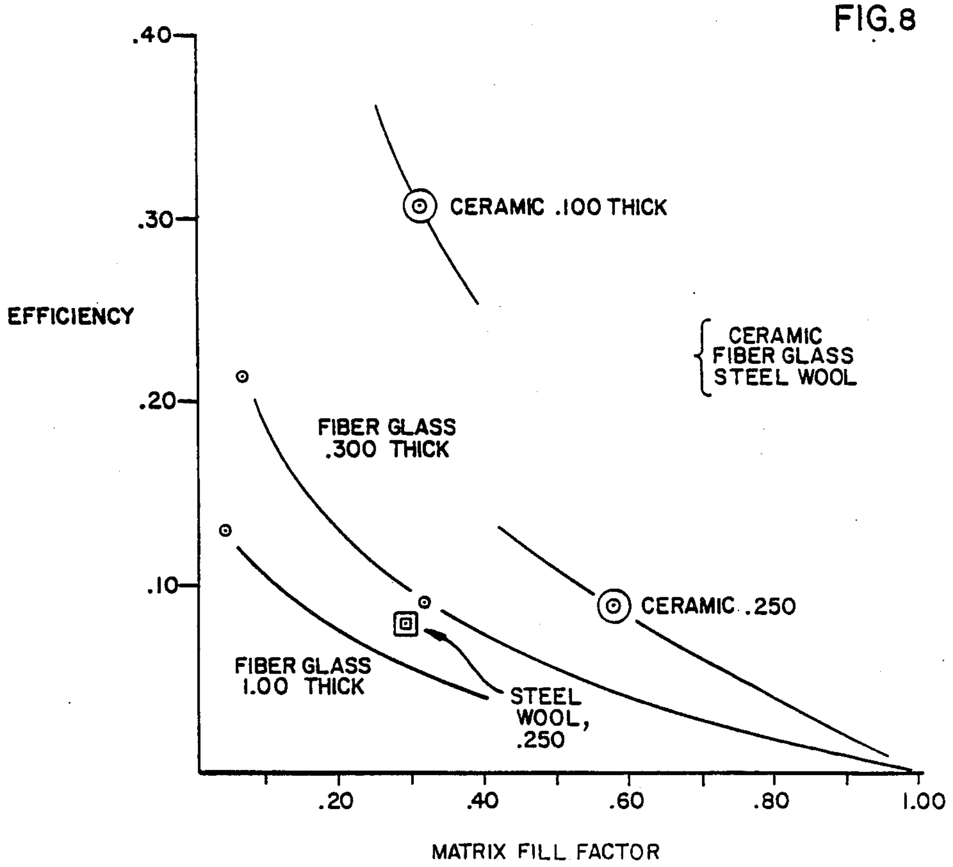

Test results were plotted in FIGS. 7 and 8. FIG. 9 is derived from the data for FIGS. 7 and 8, and generalizes the behavior according to the thickness and permeability of the matrix material. In FIGS. 7-9 efficiency is defined as actual sink compliance divided by calculated limit compliance. Matrix fill factor is defined as $v_6/(v_4+v_5+v_6)$. Matrix solid fill factor is defined as $v_6$ (solids only)$/(v_4+v_5+v_6)$.

FIG. 7 is for "Thinsulate M-400" (trademark of 3M Co.), a matt of very thin polyolefin fibers with (as manufactured) density of 40 $Kg/km^3$. FIG. 8 is for glass and "REFRASIL B100-1" (trademark of HITCO, Cardena, CA), a ceramic fiber material. The ceramic material is treated by acid leaching and firing glass fibers and has a porosity that is not characteristic of fiber glass. Its aspect ratio (surface area/ceramic volume), is much higher than for fiber glass. The fibers have very small diameter. The fiber glass used is "Realistic Acoustic Fiber," catalog No. 42-1082 from the Radio Shack Corporation. A data point for EXTRA FINE steel wool is also plotted. The actual data for this sequence of tests are tabulated in Tables D and E below, with Table E being a continuation of Table D and with anomalous results (outliers) being included.

TABLE D

| $C_{5SINK\ ACTUAL}$ Per $In^3 \times 10^{-8}$ | MATERIAL THICKNESS INCH | MATERIAL | MATRIX FILL FACTOR | R-113 ONLY | R-113 AND $H_2O$ | TEST NO. | EFF. = $\frac{C_{5SINK\ ACTUAL}}{C_{5SINK\ LIMIT}}$ |
|---|---|---|---|---|---|---|---|
| GOOD TO EXCELLENT | | | | | | | |
| 97.96 | .063 | COTTON | .585 | | X | 54A | .107 |
| 97.96 | .063 | COTTON | .578 | | X | 54B | .103 |
| 78.86 | .063 | M-400 | .207 | | X | 68 | .377 |
| 72.49 | .100 | CERAMIC | .262 | X | | 45 | .310 |
| 64.22 | .100 | CERAMIC | .700 | X | | 75 | .112 |
| 62.31 | .125 | CS-210 | .373 | X | | 42 | ..214 |
| 53.19 | .150 | M-400 | .254 | X | | 43 | .279 |

TABLE D-continued

| $C_{5SINK\ ACTUAL}$ Per $In^3 \times 10^{-8}$ | MATERIAL THICKNESS INCH | MATERIAL | MATRIX FILL FACTOR | R-113 ONLY | R-113 AND $H_2O$ | TEST NO. | EFF. = $\frac{C_{5SINK\ ACTUAL}}{C_{5SINK\ LIMIT}}$ |
|---|---|---|---|---|---|---|---|
| 51.68 | .150 | M-400 | .365 | | X | 62 | .103 |
| 48.93 | .150 | M-400 | .521 | X | | 74 | .118 |
| 48.79 | .150 | COTTON | .195 | X | | 44 | .352 |
| 45.68 | .150 | CS-210 | .180 | X | | 41 | .330 |
| 45.24 | .250 | CERAMIC | .575 | X | | 16B | .086 |
| 44.27 | .150 | M-400 | .173 | | X | 66 | .223 |
| FAIR | | | | | | | |
| 33.16 | .500 | M-400 | .249 | | X | 67B | .102 |
| 30.93 | .200 | COTTON | .378 | X | | 72 | .100 |
| 29.53 | .200 | CS-210 | .351 | X | | 71 | .114 |
| 26.04 | .450 | CERAMIC | .319 | X | | 16 | .090 |
| 24.56 | .400 | M-400 | .211 | X | | 32B | .135 |
| 21.95 | .500 | M-400 | .178 | | X | 67A | .087 |
| POOR | | | | | | | |
| 18.31 | .200 | FIBER GLASS | .265 | X | | 73 | .088 |
| 16.15 | .250 | STEEL WOOL | .240 | X | | 31 | .078 |
| 14.16 | .700 | M-400 | .148 | X | | 32A | .116 |
| 12.93 | .500 | CS-210 | .113 | X | | 20 | .135 |
| 10.83 | .400 | FIBER GLASS | .069 | X | | 46 | .208 |
| 3.59 | 1.00 | FIBER GLASS | .031 | X | | 17 | .127 |
| 3.47 | 1.25 | COTTON | .042 | | X | 14 | .056 |
| 2.07 | 1.00 | COTTON | .053 | X | | 19 | .053 |
| OUTLIERS | | | | | | | |
| 19.50 | .150 | M-400 | .321 Insufficient | R-113 | X | 61 | .037 |
| 18.96 | .200 | M-400 | .193 Data Error | X | | 32C | .112 |

TABLE E

| TEST NO. | $\frac{v_4 + v_5}{v_4 + v_5 + v_6}$ | $C_4 + C_{5\gamma} + C_{5CONDENSE}$ Per $In^3$ $(v_4 + v_5 + v_6) \times 10^{-8}$ | $C_4 + C_{5MIX}$ Per $In^3$ $(v_4 + v_5 + v_6) \times 10^{-8}$ | $C_4 + C_{5MIX}$ FACTOR ABOVE ISOTHERMAL AIR | $C_4\ C_{5MIX}$ FACTOR ABOVE ADIABATIC AIR |
|---|---|---|---|---|---|
| 54A | .415 | 10.88 | 108.84 | 3.99 | 5.58 |
| 54B | .422 | 11.06 | 109.02 | 3.99 | 5.59 |
| 68 | .793 | 20.78 | 99.64 | 3.65 | 5.11 |
| 45 | .738 | 19.34 | 91.83 | 3.36 | 4.71 |
| 75 | .300 | 7.86 | 72.08 | 2.64 | 3.70 |
| 42 | .627 | 16.43 | 78.74 | 2.88 | 4.04 |
| 43 | .746 | 19.55 | 72.74 | 2.66 | 3.73 |
| 62 | .635 | 16.64 | 68.32 | 2.50 | 3.50 |
| 74 | .479 | 12.55 | 61.48 | 2.25 | 3.15 |
| 44 | .805 | 21.10 | 69.89 | 2.56 | 3.58 |
| 41 | .820 | 21.49 | 67.17 | 2.46 | 3.44 |
| 16B | .425 | 11.14 | 56.38 | 2.07 | 2.89 |
| 66 | .827 | 21.67 | 65.94 | 2.42 | 3.38 |
| 67B | .751 | 19.68 | 52.84 | 1.94 | 2.71 |
| 72 | .622 | 16.30 | 47.23 | 1.73 | 2.42 |
| 71 | .649 | 17.01 | 46.54 | 1.70 | 2.39 |
| 16 | .681 | 17.85 | 43.89 | 1.61 | 2.25 |
| 32B | .789 | 20.68 | 45.24 | 1.66 | 2.32 |
| 67A | .822 | 21.54 | 43.49 | 1.59 | 2.23 |
| 73 | .735 | 19.26 | 37.57 | 1.38 | 1.93 |
| 31 | .760 | 19.92 | 36.07 | 1.32 | 1.85 |
| 32A | .852 | 22.33 | 36.49 | 1.34 | 1.87 |
| 20 | .887 | 23.25 | 36.18 | 1.33 | 1.86 |
| 46 | .931 | 24.40 | 35.23 | 1.29 | 1.81 |
| 17 | .969 | 25.40 | 28.98 | 1.06 | 1.49 |
| 14 | .958 | 25.11 | 28.58 | 1.05 | 1.47 |
| 19 | .947 | 24.82 | 26.89 | .98 | 1.38 |
| 61 | .679 | 17.79 | 37.30 | 1.37 | 1.91 |
| 32C | .807 | 21.15 | 40.11 | 1.47 | 2.06 |

Matrix Fill Factor—Effect on Efficiency

In all cases, as shown in FIG. 9, highest efficiency of use of H.S.M. occurs for lowest fill factors.

As the fill factor is increased by adding more liquids, there occur an increasing number of locations where micro-puddles form and remain. At these locations heat transfer equations show reduced efficiency of usage of heat sink capacity at finite frequency.

Of course, it is of greater benefit to optimize total system compliance rather than to maximize efficiency of heat sink utilization, so in this regard FIG. 10 is more to the point.

Matrix Fill Factor—Effect on $C_{SINK}$

FIG. 10 shows a family of curves that is characteristic for all systems, and confirmed by the tests.

As liquid is added to the system to provide more heat sink, the compliance first tends to follow increasing heat sink linearly. However, when enough liquid has been added to begin the process of micro-puddle formation, linearity is replaced by curvature, and diminishing influence is realized, although peak compliance has not yet been reached. For each system design of matrix, matrix thickness, fluid selection, frequency, and other factors, the point of absolutely diminishing effect (maximum compliance) is reached. With the addition of still more liquid, the compliance must tend toward zero as the space becomes completely filled with liquid.

In this regard some matrix materials "peak out" much sooner than others. Steel wool is the poorest (test 31 in Tables D and E). Next poorest is acoustic fiber glass which will simply retain only a small volume or weight of liquid, allowing the remainder to flow to a large puddle at the bottom of the container. Wetted cotton and M-400 are quite good, allowing viable matrix space fill factors of 30% and higher, if sections are thin. The special ceramic fibers, though expensive, appear to have an outstanding ability to hold great quantities of liquid (test 16B) up to 50% matrix fill factor without losing much sink compliance. This material appears to abhor the type of matting in which large interior regions become solidly filled with liquid and therefore exhibit zero compliance for the subregion.

Matrix Material Thickness

For all materials, efficiency is lower for larger thickness of the material. This occurs for at least two reasons:

(1) At interior locations, the mixture of saturated vapors and super heated vapors will quickly be "swept" of some of the saturated vapors, thereby reducing local effectiveness.

(2) In regions of lesser permeability (and the matrix regions have less permeability) the dynamic pressure distribution is not uniform. Phase shifting will contribute a deleterious effect at interior regions, especially at higher frequencies.

Fluid Choice—ccc—R-113

The thermodynamic theory and the roles played by H.S.M. and ccc were confirmed in several ways by the series of 29 tests of Tables D and E. Efficiencies of H.S.M. usage were quite reasonable, ranging from a low of 5.3% (test 19) to a high of 37.7% (test 68). Data variations and trends showed good behavior in the efficiency and $C_{SINK}/in^3$ factors. Furthermore, the trends and variations were consistent with and explainable by the various elements of the theory.

The table (Table C) of ccc values shows R-113 to be one of the best interactive fluids for use at 70° F. and 14.7 psi ambient. Its ccc value of 0.606 was used in the reduction of the test data, which is a roundabout way of confirming the correctness of the theory and of the value calculated for ccc, by the test of reasonableness.

For the 29 tests, R-113 was the interactive fluid used. For three other tests, not reported here, R-11 was used, very near its boiling point, and it exhibited superior compliance due to the volume $v_4$ having been driven to zero. The R-11 system, with no super heated vapors, was difficult to control (i.e., its operating range, $\Delta T$ with $\Delta T$ approaching zero, could not be maintained). For this reason, numerical data was not obtained. In two other tests, $H_2O$ was the only interactive fluid used. As predicted by ccc=0.0263 its $C_{SINK}$ compliance was very low. In fact, it showed negative values, but by such a small margin that one must conclude that small data inaccuracies were responsible for the negative test value, which is otherwise not a possibility.

MATRIX MATERIAL HEAT CAPACITY

The heat capacity characteristic of matrix materials is one of several important matrix properties:

Dry Cellulose, organic fibers

If devoid of saturating, wetting liquids these materials have low heat capacity. However they are never encountered in the dry state in the systems under discussion.

Wet organic fibers

If the fibers are saturated with liquid they tend to take on the characteristics of the liquid as to heat capacity.

Plastic fibers

These fibers have intermediate values of heat capacity. In well designed systems, their role may be primarily mechanical rather than thermo dynamic, and frequently their contribution to total heat sink may be neglected with only small error.

Glass or Ceramic fibers

Much like plastic fibers. In good systems, the role is primarily mechanical.

Metal fibers

As shown in Table F below, metal fibers have intermediate values of heat capacity.

$$\text{Heat Capacity } c_v' = \frac{\text{Btu}}{°\text{F.}} \text{ per } 27.76 \text{ in}^3$$

TABLE F

| Material | $c_v'$ |
|---|---|
| R-113, Liquid | .34 |
| Water | 1.00 |
| Plastic | .50 |
| Glass | .47 |
| Steel | .84 |
| Aluminum | .58 |
| Copper | .84 |
| Gold | .60 |
| $H_2O$ Wetted Organic | .80 |

While metal fibers have reasonable heat capacities they performed very poorly in the test series.

SUMMARY—MATRIX FIBERS

Very thin fibers of whatever material will play only a secondary heat sink role in well designed systems. Heat sinks may be "enlarged" in three ways:

(1) The matt should be sufficiently dense that matrix solid fill factor becomes 0.01 to 0.10, maximizing sites.

(2) The matt should be made saturable or wettable, and liquid should be added to increase matrix fill factor (and therefore H.S.M.) to the optimum value for the matrix being used.

(3) Generally, heat sinks using high proportions of $H_2O$ will have highest H.S.M. as shown by Table F.

$H_2O$ as Heat Sink

The thermodynamic theory indicates that solid and liquid materials in the matrix contribute heat sink effects. Therefore liquid $H_2O$ can advantageously be substituted for some of the liquid R-113 in the matrix region in order to achieve as much as a 3 to 1 liqid heat sink improvement factor on a volumetric basis because:

$$\left(\frac{c_v H_2O}{c_v R\text{-}113}\right)\left(\frac{\text{Density } H_2O}{\text{Density } R\text{-}113}\right)=\left(\frac{1.0}{.214}\right)\left(\frac{1.0}{1.57}\right)=2.98$$

(On a weight basis, $H_2O$ is 4.67 times better)

In real systems, not all of the liquid "FREON" can be displaced and the solid materials cannot be totally displaced because they are required for mechanical reasons. A net overall enhancement of H.S.M. by a factor of approximately 2 can be realized in well designed systems. The tests confirmed some such improvement:

Cotton Matrix Using $H_2O$ and R-113

When the fibers of the matrix are absorbent, they can be made to absorb $H_2O$ preferentially to R-113, and this is related to the immiscibility of the two liquids. Now, liquid R-113 resides as a sheath or in micro-droplets on the outer surfaces of the $H_2O$ saturated fibers. The $H_2O$ performs well as a heat sink in this case.

In tests 14 and 19, similar cotton matrix systems exhibited almost identical efficiencies of employment of heat sink materials with and without liquid $H_2O$ usage, but the system with $H_2O$ showed $C_{SINK}$ 1.67 greater than for the system with R-113 alone. This was almost exactly the ratio in which the heat sink has been "enlarged" by substituting liquid $H_2O$ for some of the liquid R-113.

In tests 54A, 54B (both cottom matrices), $C_{SINK}$ per $in^3$ of matrix space was $98\times10^{-8}$, the highest value of the test series. Next highest at 78.9 was test 68 (M-400 matrix). These three tests all used $H_2O$ to displace liquid R-113, thus enhancing H.S.M. Furthermore, test 68 achieved 38% efficiency of utilization of H.S.M., the highest value of the test series.

COMPLIANCE MEASUREMENTS—SUMMARY

In the thermodynamic theory, system limit performance does not depend on system architecture or on physical properties of materials other than their thermodynamic properties. For real systems operated at finite frequencies, the architecture and fiber shapes, sizes, wettability, etc. play large roles. These effects have been discussed and related to compliance test results.

It will be helpful to introduce coefficients into the theoretical definition of $C_{SINK}$: ($C^*_{SINK}$ pertains to real systems)

$$C^*_{SINK}=K_1K_2(\text{H.S.M.})\ (\text{ccc})$$

For real systems at real frequencies $K_1$=Derating factor resulting from system architecture and materials properties considerations $K_2$=Frequency depending derating factor Tables D and E show that good materials choice, and good architecture along with heat sink enhancement can achieve $C^*_{SINK}$ improvements of more than 20 to 1 when compared with systems in the "poor" category.

The fiber glass and steel tests in the "poor" category represent the sum of the teachings of previous investigators for non-servoed systems.

In contrast to test 17, which establishes what might be achieved using fiber glass, tests 31, 46 and 73 show material improvements that benefit from (1) thin matrices, (2) optimum matrix fill factors, (3) organic fibers and (4) liquid $H_2O$, which are new art techniques.

Comparatively, therefore, by the teachings of this invention, $C^*_{SINK}$ can be made to exceed $72\times10^{-8}$ per $in^3$, which is a factor of 20 better than $3.6\times10^{-8}$ for prior art as represented by test 17.

Approximately, this improvement of 20× is made up of:

2X, substitution of $H_2O$ for some of the liquid R-113.

3X, H.S.M. enhancement by designing matrices and selecting materials to hold more liquids, with thin wettable fibers, very well spatially distributed.

3X, architectural considerations, primarily matrix thinness and communicating channels.

REGARDING TEMPERATURE-PRESSURE SERVOS

Figure 11:
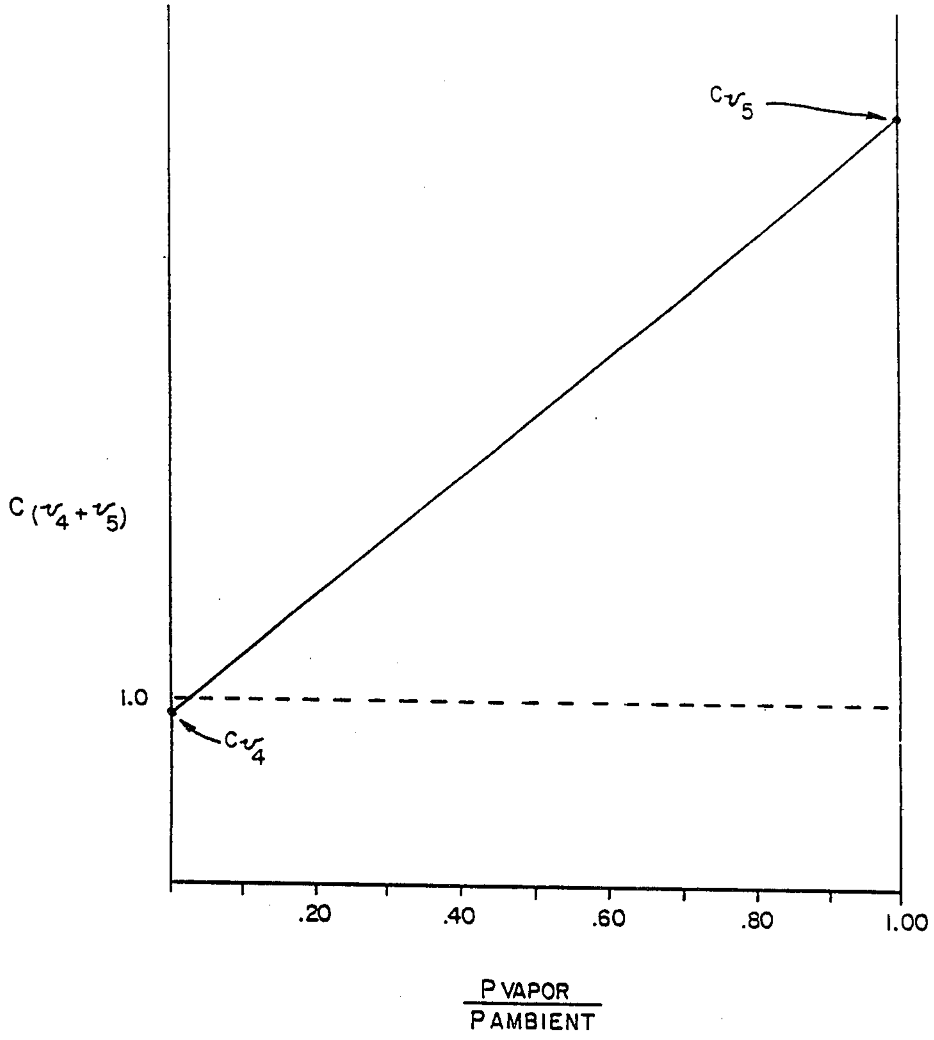
FIG. 11 is a graph which shows the variation in matrix space compliance as a function of the partial pressure of the condensable fluid.

FIG. 11 and the equation from which it was plotted show that matrix volume compliance can be more than doubled by designing a system such as one based on R-113 to operate near the boiling point (about 117° F.) rather than at room ambient where the partial pressure of the fluid is about 6 psia.

When this is attempted by a temperature or pressure servo means in a system in which there is a total or near total exclusion of super heated vapors the system becomes very difficult to control. An error 1° F. on the low side will cause total collapse of the enclosure bag, or alternatively an error of 1° F. on the high side will add a super ambient pressure of 0.28 psi which will pressurize the bag causing the membrane of the bag to become a sound reflective surface, preventing the entry of pressure variations of the wave and driving the effective compliance of the enclosed bag space toward zero.

Servos become super sensitive to ambient temperature or pressure changes.

By designing the system to operate with saturated vapor partial pressures 10 to 15% below ambient and including a partial volume of super heated vapors of air as a buffer, these problems are alleviated, yet compliance performance is only slightly reduced as shown by FIG. 11. For R-113, a temperature of about 110° F. (partial pressure of about 12.75 psia) will provide about 90% of maximum achievable compliance, but will be much more tolerant and easier to control. A system of this type is schematically illustrated as 61 in FIG. 20 in which only the low frequency of woofer section of a high fidelity system is shown. Loudspeaker systems of this type are frequently called subwoofers. The system consists of a wooden enclosure 62 in which has been provided a woofer 64 which is intended to be connected to and driven by an electrical signal source (not shown) representing sound to be transduced into acoustic waves. Multiple modules 66 whose enclosing surfaces are transparent to acoustic waves but impervious to gases, vapors or liquids are fastened interior to the wooden enclosure 62. Thus far, the system is very similar to the woofer section of the system described in FIG. 1. The interior enclosures or bags 66 contain as before solids, liquids and vapors to provide the interactive two-phase, compliance system of the invention, with communicating channels 46 between the bags 66. The formula for the interior of bags 66 is however altered in these respects:

3M "Thinsulate" M-400 is used as the matrix layer material rather than cotton. The M-400 is cut into rectangular sheets whose two dimensions are just slightly smaller than two of the three dimensions of the enclosing bag. Sheets of open cell rigid plastic foam of coarse grade and of ⅛" thickness are cut to the same rectangular dimensions as the M-400 matrix layer material. Then a stack of alternating layers of the two materials is made, during which operation the faces of the M-400 material become impaled at multiple facial locations on the barbs that exist on the broad faces of the open cell foam material. (These barbs or single ended semi-rigid fibers are naturally occurring during manufacture of the open cell foam layer material). In this way a unitary structure results which has alternate layers of adequately dense matrix material interspersed between layers of the open cell foam which is a material of very high permeability and which therefore forms a small inter-layer communicating channel(s) as well as a mechanical support. The inter-layer spaces equalize effects of an impressed displacement or pressure throughout the matrix and distributed fluid system. This stacking or layering is continued until the stack height becomes appropriate in relation to the third dimension of the enclosing bag. The inter-layer spaces and the thin M-400 layers establish pressure wave communication with the interior of each M-400 layer.

Figure 20:
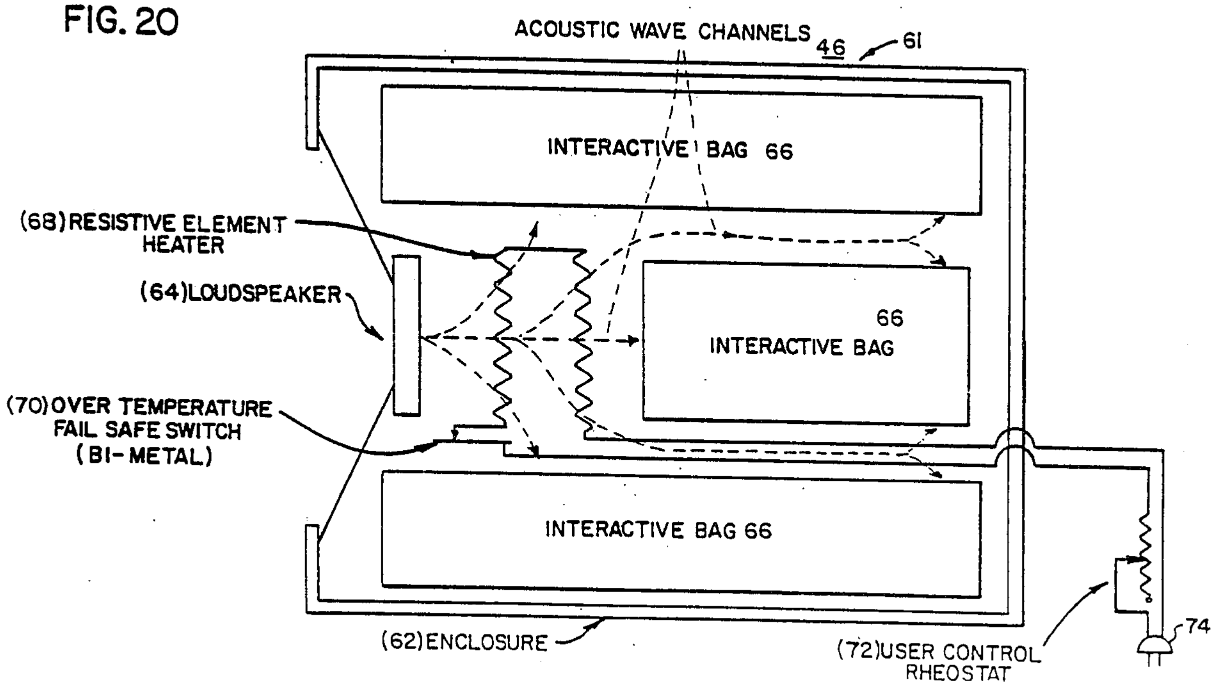
FIG. 20 is a schematic representation of a non-servoed system which can readily be adjusted to achieve performance nearly equal to servoed systems.

The whole is then wetted with $H_2O$ (and of course the M-400 shrinks in thickness, as before) until the Matrix Fill Factor reaches about 0.20 following which the stack is placed in the enclosing bag. Liquid R-113 is then poured in amounting to about 1/10 the quantity of $H_2O$. The open bag is equilibrated for some time at 110° F. before being sealed. This equilibration will automatically provide the correct amount of air for provision of the pressure buffering effect. No R-11 is used. After sealing the bag is tumbled as before and is then ready to be mounted as shown in FIG. 20.

The system is additionally provided with an electrical resistance heating means 68, and a failsafe over-temperature switch 70 which may be of bi-metal construction, for example. The heating element and the safety switch are both mounted interior of the enclosure 62 but external to the multiple interactive bags 66, in the air space of the central trunk communicating channel. To complete the electrical heating circuit there is a rheostat 72 to be set or adjusted by the user and a plug 74 for connecting the circuit to a source of electrical power. An ON-OFF switch (not shown) may also be connected in electrical series connection to conserve electricity when the system is not in use.

When the system is not energized by electrical power, the bags will collapse to a degree as the R-113 produces lowered vapor pressure as a reslt of ambient temperatures which become lower than 110° F. When this occurs, some, not all of the R-113 vapor will condense with the result that the air will become a larger proportion of the vapors and will exert a larger vapor pressure therefor. As bag collapse progresses, the solids structure inside the bag (matrix, matrix support structure) will experience some compressive force and will in this way make up the force or pressure difference between the bag exterior and the bag interior. All materials inside the bag are conserved.

When electrical power is re-applied, it will take a considerable length of time for the system to equilibrate at about 110° F., but when it does, the system will be restored to original condition (The M-400 material, for example, will not remain permanently compressed and matted, but will regain its designed operating loft.).

Unlike servoed systems which have been taught as excluding superheated vapors this system includes 10 to 15 percent superheated vapor, which means that the system need not be held precisely at 110° F., but may be allowed to vary several degrees in the neighborhood of 110° F. The bag will accommodate by changing its enclosed volume slightly, so that total pressure inside will always equal total ambient pressure outside, with the superheated vapors and the saturated vapors automatically adjusting their partial pressure contributions so as to exactly maintain zero pressure differential across the bag membrane, as bag volume changes slightly.

For given ambient temperature and pressure, the rheostat, correctly set, need never by readjusted. The system, at 110° F. as an example exactly balances the energy of electrical heat input with the outflow of heat by radiation, conduction and convection from all outer surfaces of the system enclosure 62 and the woofer diaphragm 64 over long periods of time. The heating system does not servo in any sense of the word; but some means must be provided to assist the user in obtaining an initial correct setting for the rheostat. Several simple means are possible:

The manufacturer may provide graduated marks on the dial of the rheostat along with a printed table to select a single graduation for a given ambient temperature and ambient pressure set. Or a transparent window may be provided in enclosure 62 to allow the user to observe the volumetric behavior of the bag(s) 66 so as to adjust the rheostat 72 until the bag appearance matches the description supplied by the manufacturer. Other methods of assistance will occur to those skilled in the art including the provision of a normally open contact (not shown) on the bi-metal safety switch contact, the normally open contact being wire in circuit to energize an indicator light whose illumination would be indication that the rheostat setting was too high.

With the means described here and in FIG. 20, there is provided a simple and inexpensive method for obtaining nearly all of the performance benefit (high compliance) that would otherwise result from a servoed system but without its attendant complexity, unreliability and expense.

The several factors of improvement due to the present invention are independent of the use of servos. If servos are used, some air should be included nevertheless to obtain the benefits which have been outlined.

The benefits of the invention have been confirmed both theoretically and empirically, and it has been shown that an increase in the volumetric compliance, relative to air, of greater than a factor of five has been achieved in tests. In considering the polytropic equation for gases a number of special cases are observed. In the adiabatic case, $n=\gamma$, and $\gamma$ is a value between 1.06 and 1.67 for various gases, so that it can be said that in adiabatic compressions the pressure always rises proportionately more than the volume decreases. In the isothermal case, with temperature held constant during compression and expansion, n is equal to 1 and the pressure is directly inversely variable relative to volume. In some polytropic systems, n will tend to be a constant between 1.0 and $\gamma$ which means that although some heat exchange occurs there is nonetheless a greater pressure change than a volume change. In other special cases of the polytropic system, heat is added during compression. In this situation n is greater than $\gamma$, which means that pressure changes relative to volume changes are maximized.

Only in the present system, however, does the (apparent) polytropic gas equation apply under circumstances in which heat is passively removed during compression substantially more rapidly than isothermal conditions would dictate, while conversely heat is added during expansion in like fashion, giving a value of n of substantially less than 1, down to the range of 0.25 and less.

The role of heat exchange will again be emphasized, as it is central to the behavior of this system.

If an otherwise adiabatic gas compression/expansion super heated system is provided with an effective heat transfer means to a large heat sink, then system compliance will be enhanced, with the value of n in the equation $P_1V_1^n=P_2V_2^n=\text{Constant}$ being reduced from $n=\gamma$ and tending toward $n=1.0$. In such a modified system, heat flow to and from the sink is effectively responsible for the compliance improvements and the reduction in n values. When the modified system approaches constant temperature with $n=1.0$, the system work input/output (energy) is exactly represented by the heat energy that has been added or removed, and this is a limit for bi-directional passive gas superheat systems.

In the two-phase system according to this invention, the limit is transcended; a flow of heat occurs to and from the sink whose magnitude can be many times larger than the energy represented by the work of compression/expansion at the input to the system. This can occur because the two phases of the active vapor-liquid of the system exist in substantial equilibrium and in good communication with a large, distributed heat sink and can effect transition between states in a near reversible process with effectively no increase in entropy. The direction and rate at which the heat energy transfer with the sink occurs is triggered by, caused by and regulated by the differentials in vapor pressures and temperatures (liquid vs. vapor) that are caused to exist at the interface when the causative acoustic pressures vary slightly above and below the equilibrium ambient pressure value. The behavior is somewhat analogous to the behavior of a transistor in which the large emitter-collector current is triggered by, caused by and regulated by the small injection of current at the base.

The action is automatic, and self-regulating, with the result that the concentration of vapor phase molecules always tends toward the value that will re-establish equilibrium at the interface.

During a process of alternating, reciprocating reaction, then, large quantities of energy are in process of near reversible transfer, and alternately take the form of energy stored as heat in the sink, and at other times are converted into the extra enthalpy of the vapor phase molecules. Stated in another way, compressions can be made to occur with huge volume changes, and very small accompanying pressure changes, while expansions also occur reciprocally. In effect, the number of molecules existing in the gas phase, for the gas-liquid interactive constituent such as "Freon", is automatically adjusted so as to maintain total pressure nearly constant.

The improvement in loudspeaker performance, in terms of improved sound characteristics and measured low frequency response, has been demonstrated in practical terms. For given loudspeaker systems, for example, having a known frequency response and utilizing high efficiency non-mass loaded woofers, the resonance frequency is lowered by a factor of the order of 30–40 Hz, or more.

Because of the highly subjective nature of audience impressions as to loudspeaker quality, only a general agreement as to improvement in performance by observers can be given. However, a typical increase in volumetric compliance characteristics can be established by a straightforward test setup operated under conditions comparable to a loudspeaker as follows. A pair of loudspeaker cones are mounted in face-to-face relationship to define a sealed interior enclosure, referred to as the acoustic transmission volume. One of the loudspeakers is encompassed, around its back side, by a sealed test volume enclosure which in the actual test was of cylindrical form. This speaker is coupled to a driver amplifier to be responsive to an audio source. The other speaker functions as a pickup transducer which provides an electrical voltage which is a direct measure of the driven velocity of the two cones moving in unison.

For a first test (wherein the test volume contains only adiabatic air), the driver cone was excited to give a selected amplitude of movement (as detected by the transducer cone voice coil). In the second test, wherein the test volume contained a non-optimized high compressibility structure in accordance with the invention, utilizing "Freon 113" as the high vapor pressure constituent, substantially less energy was required to actuate the driver cone so as to obtain the same amplitude of movement at the driven cone. Tests were run at 3 Hz and 5 Hz, with results that may be characterized as improvements in volumetric compliance of 1.83 and 2.15 respectively. Substantially greater compliances are achieved in practical systems, because the test system employed only a self-supporting mass of surgical cotton in contact with a small amount of "Freon" and water.

Figure 13:
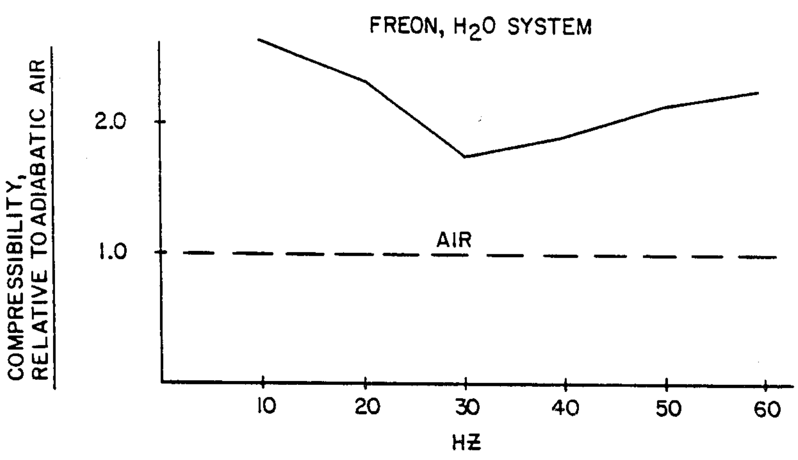
Figure 14:
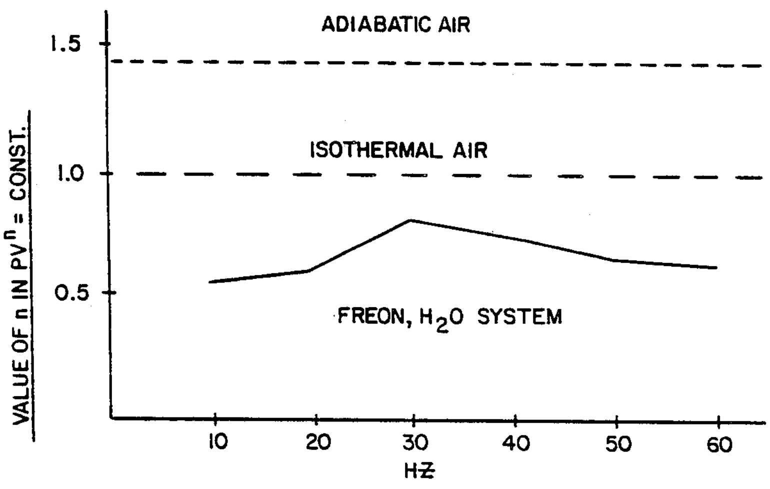

Specific results from other similar tests are illustrated in FIGS. 12, 13, and 14, which demonstrate the variation of different parameters in respect to frequency at relatively low values (e.g. below 60 Hz). The speakers in this example were 5" cones, and the back side enclosure was a metal structure providing an approximately 0.144 $ft^3$ test volume. Under these circumstances, the normalized exciting signal $E_A'$ and the measured response $E_B'$, for different frequencies, can be considered to provide an approximation of $-\Delta v/\Delta p$. The two primary system readings that were taken were first for adiabatic air, and then by filling the test volume about ¾ full with a plastic sponge material wetted with a "Freon" and water mixture. While a porous plastic, such as a common household sponge, does not provide an optimum surface area-to-volume ratio, it is adequate for giving qualitatively differing results for adiabatic air and systems in accordance with the invention, and is the basis for a very simple system. It may be seen from FIG. 12 that the compliance ratio is substantially higher relative to adiabatic air for the inventive system, expressed as the ratio $$(E_B'/E_A')\ (\text{or} -(\Delta v/\Delta p)).$$

The compliance of the two systems can be depicted in relative terms, as shown in FIG. 13. Using the relationship between $PV^n=$a constant, and the equation $-(\Delta p/\Delta v)\simeq n(P_0/V_0)$ for small compressions, the values of n can be computed, to give the relative variations in value versus frequency of FIG. 14.

In order to enhance system performance, usage of any or a number of different variables will suggest themselves to those skilled in the art. For example, the thermal mass of the heat sink can be increased to provide a maximum convenient thermal mass. In order to increase the high frequency limit at which the improved compressibility factor can be obtained, the gas-liquid phase material can be selected for high vapor pressure characteristics. The vapor pressure of the gas-liquid material can be increased, to 100% of ambient pressure if desired, to provide a maximum evaporation/condensation capability. Additionally, the gas-liquid interface system can be more widely distributed throughout the volume, in effect by increasing the surface-to-volume ratio of the interface relative to the total volume of the system. Thus high surface area, very small fibers having good wetting properties and in dispersed batt or other loose form to permit thorough gas penetration, can be employed. Space fill factor can be adjusted to adjust permeability.

For other applications, it may not be required to have such an extremely high surface-to-volume ratio, so that liquid supporting foams, porous material, sponges and the like can be used to draw liquid by capillary action or wicking action throughout their extent, from a sump if desired, distributing both the gas-liquid interface surface area and the liquid heat sink throughout the volume. It is not required that the volume be sealed, as long as there is sufficient liquid supply available for an adequately high thermal mass and for the proper gas-liquid interface, which can be dissipated to the atmosphere, being replenished if necessary. It will further be evident to those skilled in the art that principles of the invention may be utilized in a relatively open atmosphere with benefit. This may require special means, such as sprays or circulating liquid, to replenish the gas-liquid interface. The example of the loudspeaker system of FIGS. 1–3 is advantageous, in that the heat sink function is largely provided by water, which has a much higher specific heat and lower cost than "Freon". A relatively small amount of "Freon" is required to provide the needed liquid sink interfaces and the desired range of partial pressure.

Because $NH_3$ (ammonia) is highly soluble in water, an aqueous ammonia solution provides a suitable low cost compromise of various characteristics, including high specific heat, high vapor pressure (dependent upon $NH_3$ concentration) and a good value for ccc. The use of a multi-phase system wherein the gaseous molecules enter into liquid solution with a liquid of different molecular form is a variation which is within the multiphase concept of the invention, as are sublimative systems.

It will be appreciated that a high compliance factor can be of direct benefit in systems involving high energy pressure shock waves. For example, gas bags are used as both restraint and shock absorbing systems in cargo transportation systems. The restraining bag is brought to a certain internal static pressure, as determined by the mass of the cargo, its density and the protection against vibration and shock that is required. It can readily be visualized, however, that the higher the pressure the less compliant is the ordinary gas bag system, so that the greater is the resistance to an impact displacement acting on the cargo. The ability to increase the compliance, for a given static pressure, by a factor of three or more, greatly increases the shock isolation function of the system. In effect, a restrained load that is held by this system is held by the same restraining force, but in response to a given impact the load is permitted to travel over a greater distance before being stopped and is subjected to substantially lower accelerative forces.

Figure 15:
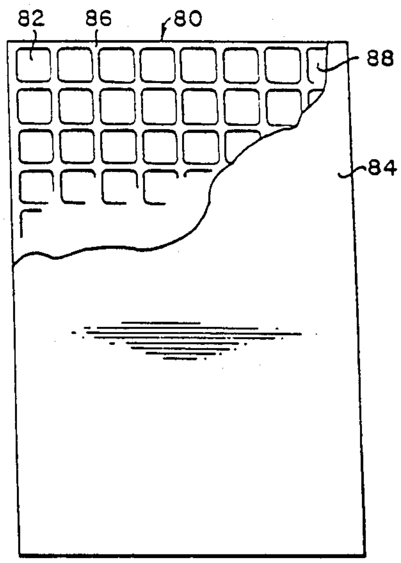
FIG. 15 is a frontal view, partially broken away, of an insulative acoustic structure in accordance with the invention.
Figure 16:
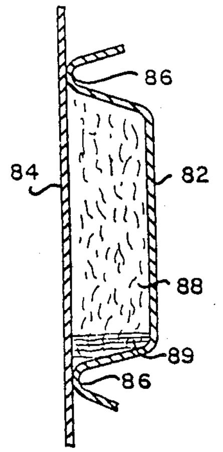
FIG. 16 is a side sectional fragmentary view of a portion of the arrangement of FIG. 15.

A novel planar system for attenuating low frequency acoustic energy is depicted in FIGS. 15 and 16. In this system, formed as a panel structure 80 of substantial area (say 4'×8'), the panel 80 has at least one face that is transparent to the acoustic wave energy. In the present example, both faces 82, 84 are of relatively thin gauge (e.g. 2 mil) plastic sheeting, with a front face 82 52 being thermoformed to define a number of cells arranged in a matrix of columns and rows, and disposed against the back panel face 82 to define interior volumes within the cells. The ridge lines 86 defining the borders for the cells are affixed, by adhesive bonding, thermal seals or the like to the back face 84 to provide a unitary structure that may be fastened to a substrate or suspended along one margin as a sound insulating blanket. Within each cell is a mass of fibers 88 having a wicking or wetting characteristic, and present in sufficient volume to provide the desired high surface area-to-volume ratio. A gas-liquid system of the type previously described is provided within each of the cells, and is depicted somewhat symbolically as a liquid pool or sump 89 disposed along the bottom of the cell when the panel structure 80 is suspended vertically. Consequently, a gas-liquid interface with an adequate wetting supply of the interactive component and a heat sink characteristic exists within each of the cells.

The impingement of acoustic waves of low frequency on this structure causes the gas mass within the volume to undergo an alternating wave action, moving molecules in corresponding fashion. This molecular movement impinges upon the fibrous structure, which provides a viscous disruption of the molecular flow when the fibers have a fixed position or substantial relative movement in relation to the molecular flow. However, whereas the fiber increments are relatively fixed and have maximum disruptive and therefore attenuating effect in reaction to the high frequency components of molecular motion, the lower the frequency the more the tendency of the fiber increments to oscillate with the moving molecules, so the lower the attenuation that is achieved, because the less the amount of viscous transduction of energy from the fluid mass into heat. Mass may be added to retard fiber motion thus increasing the viscous effect, and therefore the attenuation, either by increasing the total mass or the density of the individual fiber increments, but the benefits derived are only in proportion to the mass increase. The introduction of a gas-liquid interface, however, as previously described, results in much higher volumetric changes in comparison to pressure variations, and the high volumetric changes in turn cause correspondingly higher particle velocities. In effect, the particle velocity in the medium increases relatively with decreases in the value of n for given sound pressure levels. These explanations can be immediately supported by recourse to well known equations of sound wave behavior. Most references assume adiabatic conditions and conequently assign the value of $n=\Theta=(c_p/c_v)$ in equations where the polytropic constant appears. Since the system of the invention is not internally adiabatic, we will use the more general form, in which the values of n delineates the relative magnitudes of pressure changes to volume changes. Thus (where C denotes velocity of sound in the medium):

$$C^2 = n\frac{P_0}{\rho_0} \text{ or}$$

$$C = \sqrt{\frac{nP_0}{\rho_0}}$$

Also, $$u = \frac{p}{\rho_0 C}$$

where p is the incremental pressure of the sound waves and u is the particle velocity. Combining the two equations:

$$\text{particle velocity} = u = \frac{1}{\sqrt{n}}\ \frac{p}{\sqrt{P_0\rho_0}}$$

In this form we see that by the inverse square root law, decreases in the value of n serve to increase the particle velocities relative to the sound wave pressure increment, as was stated earlier. This relative particle velocity increase is responsible for higher viscous transduction of wave energy into heat energy and therefore enhanced sound attenuation.

Very low frequency acoustic waves are exceedingly difficult to attenuate by any prior passive means and the improvements possible by means of the present invention may be expected to find wide application. In regard to loudspeaker systems any such attenuation would generally be viewed as beneficial, but at the lowest audible frequencies, attenuations in the interior of the enclosure, even with the enhancements claimed are, from a force, pressure of energy point of view small with respect to the direct benefit of enhanced compliance. In loudspeaker applications designed primarily for enhanced compliance, Matrix Fill Factor and Matrix Solid Fill Factor are specified at high values, and matrix permeability to gaseous flow is low consequently. The lowered permeability is accommodated by the provision of communicating channels.

In many applications designed primarily for sound attenuation low permeability may not be susceptable. This situation may be accommodated in at least two ways: A given mass of solids and liquids may be designed to be less dense and thereby characterized by lower Fill Factors and higher permeability. This design will occupy more space. The second method is to use matrices and Fill Factors which yield maximum compliance factors and therefore maximum attenuation, and then additionally provide communication channels that are open at both ends and whose channel axis is in the same direction as the direction of sound propagation through the sound panel or blanket. A blanket of this type will have the permeability attributable to the open channels but also the improved attenuation attributable to the multiplied compliance. The design shown in FIGS. 15 and 16 is not optimized, but is of the second class.

Figure 17:
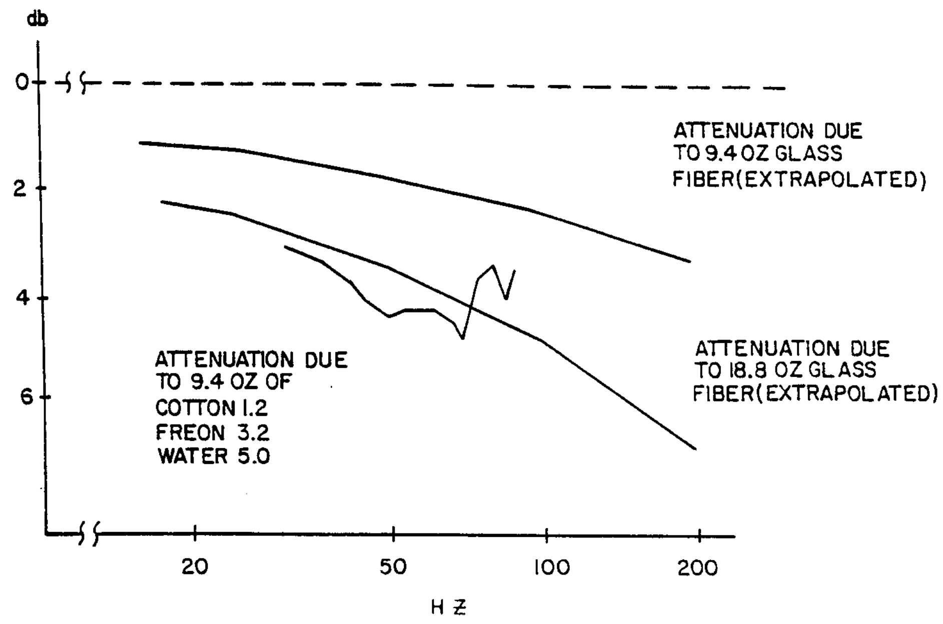
FIG. 17 is a graphical representation of attenuation characteristics for a system in accordance with the invention.

Straightforward loudspeaker systems have been utilized, together with various sample materials and configurations constructed in accordance with prior art techniques, and others in accordance with the invention, to illustrate the improvements achieved on a relative basis. For example, in one test a pair of loudspeaker systems are disposed in facing relation with a giving spaceing (1 meter) between them. A first of the loudspeaker systems was driven with a low frequency signal generator at various frequencies up to about 100 Hz, while the second system was used as a microphone, the signal induced in the coil under movement of the speaker cone being coupled through an amplifier to an oscilloscope for display of the velocity of excursion of the speaker cone in response to the exciting acoustic waves. With this configuration, samples of different materials were placed in an acoustically transparent holder interposed between the sound source and the "microphone", in a constant position. The materials used ranged from cotton alone, to cotton impregnated with water (to determine the effect of its mass or weight) and the cotton impregnated with "Freon 11" along with water. Results consistent with the theory are obtained with such a system, and are most clearly apparent at the frequencies below 90 Hz. When the test data was reduced and plotted, dramatic improvement in sound attenuation was observed, as shown in FIG. 17. In this Figure, the data points for attenuation of a system having 1.2 oz. of cotton, 3.2 oz. of distributed "Freon" and5.0 oz. of distributed water for a total weight of 9.4 oz., show superior sound attenuation at 70 Hz and below. In comparison to the attenuation achievable with an equal weight and even twice the weight of glass fibers, the improved low frequency properties are evident. The glass fiber attenuation values are extrapolated from Beranek, "Noise Reduction," McGraw-Hill, 1960, due to the lack of available data below 100 Hz.

Figure 18:
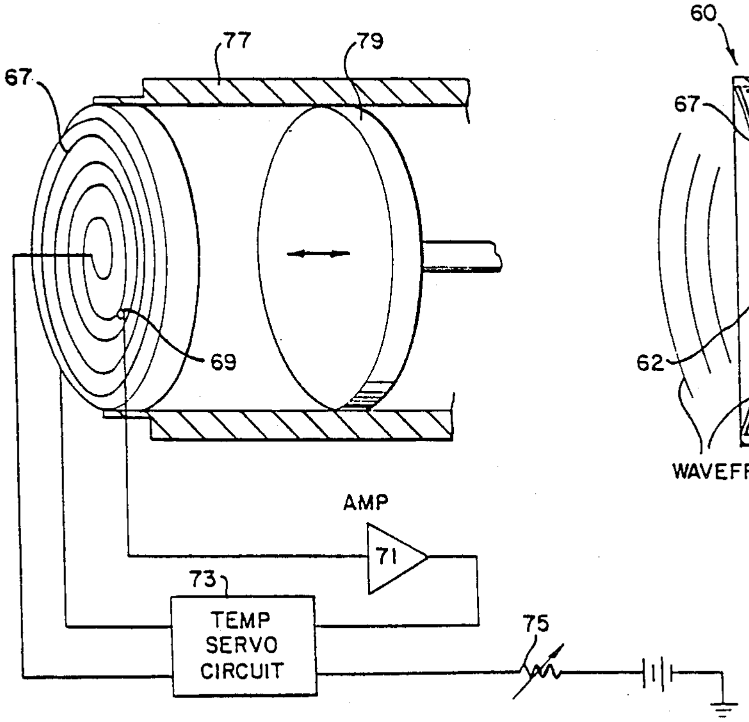
FIG. 18 is a perspective view of an acoustic lens system incorporating a temperature control feature in accordance with the invention.
Figure 19:
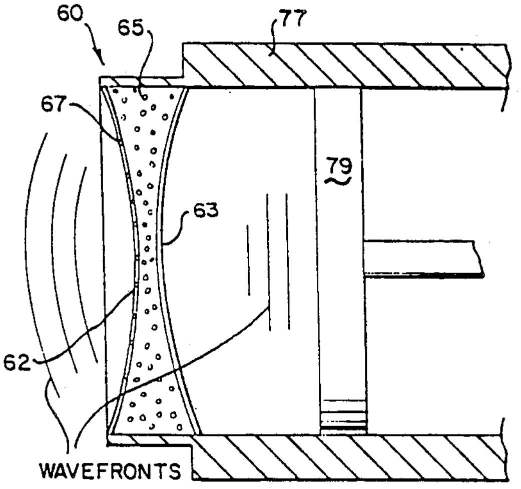
FIG. 19 is an enlarged fragmentary sectional view of the arrangement of FIG. 18.

A decrease in relative sound propagation velocity, C, in the gas-liquid interface volume may also be utilized in an acoustic lens structure, because the refractive index of a medium varies inversely with the velocity of propagation in that medium. In the example of FIGS. 18 and 19, an acoustic lens system is provided in which another alternative feature, that of high temperature stabilization of the gas-liquid interface, is employed. In this example, the lens 60 comprises a pair of concave cover sheets 62, 63, substantially transparent acoustically, providing a sealed environment for an interior gas-liquid interface system of one of the types previously described. A porous wettable member 65 within the enclosure provides the volumetric distributing means for the gas-liquid interface, and the desired thermal mass and high surface-to-volume ratio. A heating coil 67 of resistance wire is helically disposed on one of the broad faces of the wicking member 65 so as to provide substantially equal heating through all areas of that member and the interior of the lens 60. A temperature sensitive thermistor 69, mounted in the enclosure, senses the temperature of the lens 60, and provides, through a coupled amplifier 71, a signal to an associated temperature servo circuit 73 which also receives a signal from a selectable reference source depicted by an adjustable resistor 75. Adjacent the back side of the acoustic lens 60, an enclosed cylinder 77 containing a pressure generating piston 79 is actuated to provide plane pressure waves to be converted into a spherical wave front by the lens 60.

With the capability of heating the lens 60, it is feasible to maintain a temperature that is closely controlled and remains near the boiling point of the condensative constituent. Furthermore, fluctuations in ambient temperature are immaterial to such a system. The princple may of course be employed in other structures in accordance with the invention.

In the acoustic wave system, a plane wave front that impinges on the concave first face of the acoustic lens 60 is, dependent upon the latex of refraction, converted into a curved wave front having the same sense of curvature as the first face of the lens 60, and proceeding through the lens to the opposite concave face, at which the curvature is increased, in the same sense, to provide a spherical wave front. Further, the lens provides an acoustic impedance matching function that permits a smaller piston to be used to couple into a large room volume.

Again, recourse to familiar equations will enhance understanding. For sound, as for light, the index of refraction, R, is the ratio of the speed of propagation in the ambient medium (air) divided by the speed of propagation in the new medium:

$$R = \frac{C_{air}}{C_{two\text{-}phase\ system}},$$

C=sound propagation velocity

We recall that sound propagation velocity in the inventive system has been reduced very substantially in comparison to the velocity in air, therefore the index of refraction increases in direct inverse proportion. Indices of refraction of 2.0 or more are achievable consistent with the other results described herein.

If one recognizes that the piston 79 depicted in FIGS. 18 and 19 comprises one example of a loudspeaker element, it can also be recognized that the lens provides a much improved acoustic coupling between a driver and the acoustic volume into which it radiates. The significance of the impedance mis-match between the loudspeaker (or other acoustic driver) and the surrounding environment into which the waves are transmitted is well known, especially at low frequencies. In the past, better coupling has primarily been achieved by acoustic impedance matching horns, which provide dispersion, but also an increasingly larger cross-sectional area to launch the acoustic waves into the receiving volume. In accordance with the present invention, the lens provides an increase of the effective apparent cross-sectional area of the driver as well as an alteration of the numerical values of the complex impedance expression establishing much more efficient coupling to the room volume, and therefore a significantly optimized acoustic impedance that is seen by the driver itself. At low frequencies the impedance matching function, in a loudspeaker system, is of greater importance than the function relating to the divergence of sound waves, although this also is of beneficial effect, depending on frequency. It is of significance also that the impedance matching characteristic is achieved without the large and expensive units heretofore needed to get comparable performance.

Although a number of forms and modifications have been described, it will be appreciated that the invention is not limited thereto but encompasses all variations within the scope of the appended claims.

What is claimed is:

1. A system for exhibiting enhanced volumetric compliance in response to acoustic waves within an enclosure, comprising:

at least two spaced apart volumetric containers within the enclosure each being substantially transparent to force, pressure or volumetric displacements acting on the container and each containing a matrix of thin spaced apart layers of microfibers spatially distributed within the container;

each of the containers further including a two phase fluid system comprising a liquid and a gas, the liquid of which were the microfibers throughout the matrix and the liquid and gas being in thermodynamic equilibrium, such that vapor molecules exist in the spaces between the fibers and the fibers and liquid provide a high surface area, volumetrically dispersed, heat sink, the spaces within the containers and between the containers being configured to define communicating channels to equalize effects of an impressed displacement within the enclosure.

2. The invention as set forth in claim 1 above, wherein the layers in the containers are sufficiently thin to maintain pressure wave communication with the interiors of the individual layers, despite the low permeability of the wetted matrix material.

3. The invention as set forth in claim 2 above, wherein the layers include means for said supporting layers despite the mass of the liquid thereon, wherein the nominal thickness of each matrix layer is less than ½ inch, and wherein the system comprises an acoustic loudspeaker system.

4. A system having high volumetric compliance in response to acoustic energy transmitted through a gaseous medium comprising:

means defining a gas-liquid interface distributed throughout a volume in operative relation to the acoustic energy, the gas being the gaseous form of the liquid at a partial pressure such that compression and expansion due to the acoustic waves interacts with the interface and absorbs or releases thermal energy by condensation or evaporation of the molecules; and means defining a liquid heat sink interface distributed throughout the volume in operative relation to the acoustic energy, the said means comprising a second liquid having a high thermal mass.

5. The invention as set forth in claim 4 above, wherein said means defining the gas-liquid interface comprises a distributed mass of fine fibers, with the liquids being disposed on the fibers to define thin liquid sheaths in good thermal communication with the fibers and also in proximity to the vapor molecules in the spaces between the fibers.

6. The invention as set forth in claim 4 above, wherein the means defining the gas-liquid interface includes means providing a high wetted surface area distributed through the interface volume.

7. The invention as set forth in claim 4 above, wherein said means defining the gas-liquid interface comprises passive means including a wettable self supporting fibrous structure disposed in operative relation to the wave energy for providing a wave transmission volume observing the law $$P_1V_1^n = P_2V_2^n = K,$$

wherein n is the apparent polytropic gas constant and is less than unity, and said passive means operates bidirectionally in response to compression and expansion cycles.

8. The invention as set forth in claim 4 above, wherein the means defining the gas-liquid interface comprises a permeable matrix of elongated solids, and where the matrix fill factor is in the range of 0.05 to 0.30, the matrix solid fill factor is in the range of 0.01 to 0.1, and the elongated solids have diameters of less than 0.003 inches.

9. The invention as set forth in claim 8 above, wherein the specific length of the elongated solids is greater than 5000 inches per cubic inch of matrix space volume and the specific surface area of the elongated solids is greater than 50 square inches per cubic inch matrix space volume.

10. The invention as set forth in claim 4 above, wherein the means defining the interface volume comprise fibers distributed in thin layers configured to provide acoustic wave communicating channels therebetween, the layers being sufficiently thin to be partially permeable to impinging acoustic waves.

11. A system having high volumetric compliance in response to acousitc energy propogation comprising:

volumetric means comprising a high surface area-to-volume ratio interface structure through which the waves may propogate;

fluid means providing a gas-liquid equilibrium physically distributed on the high area interface surface;

and said system further including second liquid means having high thermal mass distributed throughout the high area interface surface structure with the fluid means for removing heat during compression and for supplying heat during expansion.

12. A system for increasing the compliance of a gas containing volume in response to acoustic pressure waves comprising:

means providing a distributed volume containing at least two fluids existing in both gas and liquid phases, the equilibrium temperature of a first of the fluids being such that the fluid co-exists in both gaseous and liquid states at ambient temperature so as to be interactive with acoustic pressure waves, the second fluid having high thermal mass and being distributed throughout the volume; and wherein the apparent polytropic gas constant of the distributed volume is substantially less than unity in the polytropic equation $$P_1V_1^n = P_2V_2^n.$$

13. The invention as set forth in claim 12 above, wherein said distributed volume means comprises means defining an enclosure for the volume, and wherein said distributed volume means comprises a high surface area liquid support within the enclosure and having the liquids of the two fluids distributed on the support, the liquids each being in saturation temperature and pressure equilibrium with the gas phase.

14. The invention as set forth in claim 13 above, wherein the system includes means providing large gas volume changes and low pressure changes in response to the acoustic pressure changes wherein the pressure change is unidirectional.

15. A system for modifying the effective compliance of a gaseous medium in response to low frequency acoustic wave energy comprising:

bidirectional heat transfer means defining a containment volume, and being responsive to acoustic wave energy in the gaseous medium for passively absorbing thermal energy during compression and passively releasing thermal energy during expansion, said heat transfer means comprising a liquid-vapor phase system substantially distributed through the volume and including at least two liquid consitituents of different equilibrium temperatures, at least one of which has an equilibrium temperature at approximately the ambient temperature of the system, said heat transfer means further including a high surface area-to-volume ratio self supporting structure.

16. The invention as set forth in claim 15 above, including in addition a third gaseous constituent distributed through the containment volume and selected to provide a pressure buffer for reducing sensitivity to ambient temperature or pressure changes.

17. The invention as set forth in claim 15 above, wherein the at least two liquid constituents comprise a first having a high thermal mass and a second which at the ambient temperature has a high vapor pressure.

18. The invention as set forth in claim 17 above, wherein the liquid constituent having high vapor pressure comprises a mixture of two liquids each having a high vapor pressure.

19. The invention as set forth in claim 17 above, wherein the liquid constituent having a high thermal mass is water and the liquid constituent having a high vapor pressure is "Freon".

20. A passive system for increasing the volumetric compliance of a gaseous volume in a loudspeaker enclosure including a speaker to modify wave behavior at low frequencies, comprising:

means disposed within the enclosure to confine a liquid having a predetermined gas partial pressure range at ambient temperature, self supporting fibrous means within the enclosure for providing a high surface area of liquid within the enclosure, the fibrous means being wetted by the liquid, and at least a second liquid in wetting contact with the fibrous means within the enclosure, said second liquid having a high thermal mass.

21. The invention as set forth in claim 20 above, wherein the means confining the liquid comprises envelope means transparent to sound waves.

22. The invention as set forth in claim 21 above, wherein the self-supporting fibrous means comprising fibers comprising principally long cylindrical filaments whose diameters are substantially less than 0.003 inch and wherein the specific length of the fibers is greater than 5000 inches per cubic inch of matrix space volume and the specific surface area of the fibers is greater than 50 square inches of per cubic inch of matrix space volume.

23. The invention as set forth in claim 22 above wherein the fibers are disposed in layers each of thinness sufficient to be permeable to impinging waves, and providing communicating channels therebetween for more uniform dispersion of the wave energy.

24. A loudspeaker system comprising:

an enclosure;

a speaker means mounted in said enclosure;

means defining a gas-liquid interface system distributed within said enclosure and in thermodynamic balance such that the volumetric compliance exhibited in response to acoustic waves is substantially increased; and means defining a body of high surface area-to-volume ratio fibers dispersed through the enclosure and wetted by the liquid, and including passages therein for pressure waves from the speaker means to equalize impressed wave energy and attendant pressure variations in all regions of the body of fibers so as to promote volumetric compliance increase from all regions of the body.

25. The invention as set forth in claim 24 above, wherein the means defining the gas-liquid interface comprises a liquid having a high vapor pressure.

26. The invention as set forth in claim 25 above, wherein the means defining the gas-liquid interface comprises a liquid having a high thermal mass.

27. The invention as set forth in claim 26 above, wherein the means defining the gas-liquid interface further includes both a liquid having a high vapor pressure and a liquid having a high thermal mass.

28. The invention as set forth in claim 27 above, wherein said means defining a gas-liquid interface comprises a matrix of elongated solids having a high area-to-volume ratio.

29. The invention as set forth in claim 28 above, wherein said elongated solids have a wicking property such that the liquid is dispersed across the surfaces of the elongated solids.

30. The invention as set forth in claim 29 above, further including means providing a sump of liquid in contact with said matrix.

31. The invention as set forth in claim 30 above, wherein the matrix of elongated solids comprises synthetic organic fibers having diameters of less than 0.003 inches and a specific length of more than 5000 inches per cubic inch of matrix space volume, the specific surface area of the fibers being greater than 50 square inches per cubic inch of matrix space volume, and wherein the matrix fill factor is in the range of 0.05 to 0.30 and the matrix solid fill factor is in the range of 0.01 to 0.1.

32. The invention as set forth in claim 24 above, wherein the system further comprises means for heating the volume within said enclosure, and means for adjustably selecting the rate of thermal energy input to raise the temperature of the gas-liquid interface system to a high level without servo control.

33. A loudspeaker system comprising:

an enclosure;

speaker means mounted within said enclosure;

means including high surface area fibrous means disposed within said enclosure and gas-liquid means distributed throughout the surface area of said fibrous means in the path of rearwardly directed waves, the gas-liquid means including a first liquid having a high vapor pressure and a second liquid having high thermal mass distributed throughout the fibrous mass, for increasing the volumetric compliance of the enclosure relative to air to an excess of three times that of air and wherein the apparent polytropic gas constant n of the liquid-vapor system has a value less than 0.5.

34. The invention as set forth in claim 33 above, wherein the liquid means comprises at least partially a liquid having a boiling point in excess of 70° F., and wherein said means for increasing the volumetric compliance further comprise envelope means encompassing said fibrous means, and the volume within said envelope means is substantially saturated with the vapor of the liquid to define a two-phse constituent.

35. The invention as set forth in claim 34 above, wherein the partial pressure of two-phase constituents is less than ambient and further a superheated vapor for equalizing pressure is contained within the volume within said envelope means.

36. The invention as set forth in claim 33 above, wherein the areal means comprises a porous, self supporting wicking structure.

37. The invention as set forth in claim 36 above, wherein the wicking structure comprises a spatially distributed mass of fibers in a sheet following a tortuous path, and wherein the liquid comprises a mixture and is distributed throughout the mass of fibers.

38. The invention as set forth in claim 33 above, including in addition means for heating the gas-liquid system to a selected temperature to increase the proportion of reactive gases within the volume.

39. A loudspeaker system exhibiting enhanced reproduction of low frequency sounds comprising:

an enclosure including walls defining an interior volume;

speaker means mounted in at least one wall of said enclosure;

and at least one volumetric compliance means disposed within the interior volume, said volumetric compliance means including a three-dimensional envelope, a support structure within said envelope defining multiple spaced apart planes, thin porous wicking means disposed along and supported by the planes to define thin layers separated by communicating channels for acoustic wave energy, and liquid means wetting said wicking means and distributed thereupon throughout said envelope, said liquid means having a substantial vapor pressure at ambient temperature to establish an interaction with acoustic waves that is substantially effective throughout all regions within the enclosure.

40. The invention as set forth in claim 39 above, wherein said liquid means comprises a mixture of at least two liquids.

41. The invention as set forth in claim 40 above, wherein the two liquids comprise water and "Freon".

42. The invention as set forth in claim 41 above, wherein the three-dimensional envelope comprises a plastic envelope surrounding the volumetric compliance means and being substantially acoustically transparent, and wherein the speaker means comprise low frequency speaker means, mid range speaker means and high frequency speaker means, the low frequency speaker means being acoustically coupled to the volumetric compliance means through the plastic envelope.

43. The invention as set forth in claim 42 above, wherein said thin porous wicking means comprises fibrous layers, the fibers thereof comprising filaments of less than 0.003" diameter and having a specific length greater than 5000 inches per cubic inch of volume of the volumetric compliance means and a specific surface area greater than 50 square inches per cubic inch of volume of the volumetric compliance means, and wherein the volumetric compliance means comprises a plurality of modules disposed within the speaker enclosure.

44. The invention as set forth in claim 42 above, wherein the low frequency speaker means comprises a pair of speakers mounted at an approximately 90° angle on the walls of the enclosure.

45. The invention as set forth in claim 39 above, wherein said liquid means comprises a mixture of three liquids.

* * * * *